(12) United States Patent
Suzuki et al.

(10) Patent No.: US 10,084,286 B2
(45) Date of Patent: Sep. 25, 2018

(54) SURFACE EMITTING LASER, SURFACE EMITTING LASER ELEMENT AND ATOMIC OSCILLATOR

(71) Applicants: Ryoichiro Suzuki, Miyagi (JP); Shunichi Sato, Miyagi (JP)

(72) Inventors: Ryoichiro Suzuki, Miyagi (JP); Shunichi Sato, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 190 days.

(21) Appl. No.: 15/124,456

(22) PCT Filed: Feb. 24, 2015

(86) PCT No.: PCT/JP2015/056020
§ 371 (c)(1),
(2) Date: Sep. 8, 2016

(87) PCT Pub. No.: WO2015/137174
PCT Pub. Date: Sep. 17, 2015

(65) Prior Publication Data
US 2017/0025820 A1 Jan. 26, 2017

(30) Foreign Application Priority Data

Mar. 14, 2014 (JP) .................................. 2014-052058

(51) Int. Cl.
*H01S 5/183* (2006.01)
*H03L 7/26* (2006.01)
(Continued)

(52) U.S. Cl.
CPC .......... *H01S 5/18377* (2013.01); *G04F 5/145* (2013.01); *H01S 5/0421* (2013.01);
(Continued)

(58) Field of Classification Search
CPC .................................................. H01S 5/18377
See application file for complete search history.

(56) References Cited

U.S. PATENT DOCUMENTS

| 5,703,898 A | 12/1997 | Ogura |
| 6,927,412 B2 * | 8/2005 | Takahashi .............. B82Y 20/00 257/103 |

(Continued)

FOREIGN PATENT DOCUMENTS

| JP | 2003-179315 | 6/2003 |
| JP | 2008-053353 | 3/2008 |

(Continued)

OTHER PUBLICATIONS

International Search Report dated Jun. 2, 2015 in PCT/JP2015/056020 filed on Feb. 24, 2015.

(Continued)

*Primary Examiner* — Hai L Nguyen
(74) *Attorney, Agent, or Firm* — Cooper & Dunham LLP

(57) ABSTRACT

A surface emitting laser for emitting light with a wavelength $\lambda$ includes a first reflection mirror provided on a semiconductor substrate; a resonator region including an active layer provided on the first reflection mirror; a second reflection mirror, including plural low refraction index layers and plural high refraction index layers, provided on the resonator region; a contact layer provided on the second reflection mirror; a third reflection mirror provided on the contact layer; and an electric current narrowing layer provided between the active layer and the second reflection mirror or in the second reflection mirror. Optical lengths of at least one of thicknesses of the low refraction index layers and the high refraction index layers formed between the electric current narrowing layer and the contact layer are $(2N+1) \times \lambda/4$ (N=1, 2, ... ).

20 Claims, 16 Drawing Sheets

(51) Int. Cl.
  *G04F 5/14* (2006.01)
  *H01S 5/40* (2006.01)
  *H01S 5/42* (2006.01)
  *H01S 5/042* (2006.01)

(52) U.S. Cl.
  CPC ...... *H01S 5/18341* (2013.01); *H01S 5/18358* (2013.01); *H01S 5/4087* (2013.01); *H01S 5/423* (2013.01); *H03L 7/26* (2013.01); *H01S 5/18313* (2013.01)

(56) References Cited

U.S. PATENT DOCUMENTS

| | | | |
|---|---|---|---|
| 8,208,511 | B2 | 6/2012 | Sato et al. |
| 8,891,571 | B2 | 11/2014 | Jikutani et al. |
| 9,124,062 | B2 | 9/2015 | Wunderer et al. |
| 9,225,149 | B2 * | 12/2015 | Suzuki ............... H01S 5/0421 |
| 9,287,682 | B2 * | 3/2016 | Motomura .......... H01S 5/18377 |
| 2001/0050935 | A1 | 12/2001 | Yokouchi |
| 2011/0170568 | A1 | 7/2011 | Kondo |
| 2013/0230070 | A1 | 9/2013 | Sato et al. |
| 2014/0023104 | A1 | 1/2014 | Suzuki et al. |
| 2014/0354367 | A1 | 12/2014 | Suzuki et al. |

FOREIGN PATENT DOCUMENTS

| | | |
|---|---|---|
| JP | 2008-274244 | 11/2008 |
| JP | 2009-188598 | 8/2009 |
| JP | 2009-272389 | 11/2009 |
| JP | 4592873 | 12/2010 |
| JP | 2011-018763 | 1/2011 |
| JP | 2013-179319 | 9/2013 |
| JP | 2013-197593 | 9/2013 |
| WO | 2013/081176 A1 | 6/2013 |

OTHER PUBLICATIONS

D. L. Huffaker, et al., "Sub-40 μA Continuous-Wave Lasing in an Oxidized Vertical-Cavity Surface-Emitting Laser with Dielectric Mirrors", IEEE Photonics Technology Letters, vol. 8, No. 8, pp. 974-976 (1996).

Svenja Knappe, et al., "A microfabricated atomic clock", Appl. Phys. Lett. vol. 65, No. 9, pp. 1460-1462 (2004).

Svenja Knappe, "MEMS Atomic Clocks", Comprehensive Microsystems, vol. 3, pp. 571-612 (2008).

Darwin K. Serkland, et al., "VCSELs for Atomic Clocks", Proc. of SPIE vol. 6132, pp. 613208-1-613208-11 (2006).

Ashok K Saxena, "The conduction band structure and deep levels in $Ga_{1x}Al_xAs$ alloys from a high-pressure experiment", J. Phys. C: Solid St. Phys., 13, pp. 4323-4334 (1980).

* cited by examiner

SURFACE EMITTING LASER, SURFACE EMITTING LASER ELEMENT AND ATOMIC OSCILLATOR

TECHNICAL FIELD

The disclosures herein generally related to a surface emitting laser, a surface emitting laser element and an atomic oscillator.

BACKGROUND ART

A vertical cavity surface emitting LASER (VCSEL) is a semiconductor laser, which emits light in a direction perpendicular to a substrate surface. The VCSEL has a feature, compared with an end-face emitting type semiconductor laser, of low cost, of low power consumption, small size, high performance, and being easily integrated two-dimensionally.

The vertical cavity surface emitting laser has a resonator structure that has a resonator region including an active layer, and upper and lower reflection mirrors provided above and below the resonator region, respectively (See Patent Document 1). Accordingly, the resonator region has a predetermined optical thickness so that light with wavelength of $\lambda$ in the resonator region in order to obtain light with an oscillation wavelength of $\lambda$. The upper and lower reflection mirrors are DBRs (Distributed Bragg Reflector) formed by laminating materials having different refraction indices, i.e. a low refraction index material and a high refraction index material, alternately. In the DBR, the low and high refraction index materials are formed so that optical thicknesses normalized by the refraction indices of the respective materials are $\lambda/4$, in order to obtain high reflectance where the wavelength is $\lambda$.

Moreover, the vertical cavity surface emitting laser is often provided with an electric current narrowing region in the Bragg reflector. There is an effect of lowering a threshold current, since a transparent electric current density of the active layer can be achieved with a low electric current according to the electric current narrowing. Furthermore, by giving a refraction index difference in a transverse direction, it is also effective for transverse mode control.

Among structures of the vertical cavity surface emitting laser, there is an "intracavity structure", in which a contact layer contacting an electrode is provided in the middle of the upper Bragg reflector and electrodes are arranged so as to surround a region where a mode control exists (See non-patent document 1). The intracavity structure may be employed according to a reason such as decreasing an influence from an increase in temperature of a layer above the active layer in the case of performing a process in the middle of the upper Bragg reflector.

Patent document 2 discloses an atomic oscillator provided with an optical system in which an end-face emitting type laser diode (coherent light source) is provided on a base, a passive optical element, a gas cell, and a photodiode (waveguide type light receiving element: light detector) provided on the base, which are serially arranged along a surface direction on a substrate. The respective elements are electrically connected to the substrate.

Non-patent document 2 discloses fabrication techniques usually applied to microelectromechanical systems (MEMS) used to reduce the size and operating power of the core physical assembly of an atomic clock. With a volume of 9.5 mm³, a fractional frequency instability of $2.5\times10^{-10}$ at 1 s of integration, and dissipating less than 75 mW of power, the device has the potential to bring atomically precise timing to hand-held, battery-operated devices. In addition, the design and fabrication process allows for wafer-level assembly of the structures, enabling low-cost mass-production of thousands of identical units with the same process sequence, and easy integration with other electronics.

Non-patent document 3 discloses a combination of microelectromechanical systems (MEMS) fabrication with atomic clocks, and gives an overview of microfabrication techniques used for chip-scale atomic clocks (CSACs), including the fabrication and integration of the critical components. Furthermore, the performance of MEMS clocks is evaluated in terms of frequency stability and sensitivity to external parameters, size, and power consumption.

Non-patent document 4 discloses a spectroscopic technique of coherent population trapping (CPT) which enables an all-optical interrogation of the groundstate hyperfine splitting of cesium (or rubidium), compared to the optical-microwave double resonance technique conventionally employed in atomic frequency standards.

Non-patent document 5 discloses high-pressure Hall effect measurements on liquid phase epitaxial crystals of $Ga_{1-x}Al_xAs$ with compositions in the range $0.23 \le x \le 0.79$, which have provided information about the relative positions of the Gamma and X conduction band minima across the system.

CITATION LIST

Patent Literature

Patent Document 1: Japanese Published Patent Application No. 2008-53353; and
Patent Document 2: Japanese Published Patent Application No. 2009-188598.

Non-Patent Literature

Non-patent Document 1: IEEE Photonics Technology Letters, Vol. 8, pp. 974-976 (1996);
Non-patent Document 2: Appl. Phys. Lett. Vol. 85, pp. 1460-1462 (2004)
Non-patent Document 3: Comprehensive Microsystems, Vol. 3, pp. 571-612 (2008);
Non-patent Document 4: Proc. Of SPIE Vol. 6132, 613208 (2006); and
Non-patent Document 5: A. K. Saxena, J. Phys. C., 13, no. 23, pp. 4323-4334 (1980).

DISCLOSURE OF INVENTION

Problem to be Solved by the Invention

However, since in the case of the intracavity structure a resistance in the vertical cavity surface emitting laser is generally great, when an electric current flows, heat is generated. There is a problem that this heat lowers the maximum optical output, shortens service life of the laser, or the like.

It is a general object of at least one embodiment of the present invention to provide a surface emitting laser, a surface emitting laser element and an atomic oscillator that substantially obviate one or more problems caused by the limitations and disadvantages of the related art.

Means to Solve the Problem

According to an aspect of the invention, a surface emitting laser for emitting light with a wavelength $\lambda$ includes a first reflection mirror provided on a semiconductor substrate; a resonator region including an active layer provided on the first reflection mirror; a second reflection mirror, including a plurality of low refraction index layers and a plurality of high refraction index layers, provided on the resonator region; a contact layer provided on the second reflection mirror; a third reflection mirror provided on the contact layer; and an electric current narrowing layer provided between the active layer and the second reflection mirror or in the second reflection mirror. Optical lengths of at least one of thicknesses of the low refraction index layers and the high refraction index layers formed between the electric current narrowing layer and the contact layer are $(2N+1)\times\lambda/4$ ($N=1, 2, \ldots$).

According to another aspect of the invention, a surface emitting laser includes a first reflection mirror provided on a semiconductor substrate; a resonator region including an active layer provided on the first reflection mirror; a second reflection mirror, including a plurality of low refraction index layers and a plurality of high refraction index layers, provided on the resonator region; a contact layer provided on the second reflection mirror; a third reflection mirror provided on the contact layer; and an electric current narrowing layer provided between the active layer and the second reflection mirror or in the second reflection mirror. A difference between refraction indices of the low refraction index layers and the high refraction index layers formed between the electric current narrowing layer and the contact layer is less than or equal to 0.232.

According to yet another aspect of the invention, a surface emitting laser element includes plural surface emitting lasers, each of which includes a first reflection mirror provided on a semiconductor substrate; a resonator region including an active layer provided on the first reflection mirror; a second reflection mirror, including a plurality of low refraction index layers and a plurality of high refraction index layers, provided on the resonator region; a contact layer provided on the second reflection mirror; a third reflection mirror provided on the contact layer; an electric current narrowing layer provided between the active layer and the second reflection mirror or in the second reflection mirror; and a wavelength adjustment region provided between the second reflection mirror and the third reflection mirror. Optical lengths of at least one of thicknesses of the low refraction index layers and the high refraction index layers formed between the electric current narrowing layer and the contact layer are $(2N+1)\times\lambda/4$ ($N=1, 2, \ldots$), where $\lambda$ is a wavelength of light emitted from the surface emitting laser. The third reflection mirror is formed by alternately laminating films formed of dielectric materials, refraction indices of which are different from each other. The wavelength adjustment region includes a first phase adjustment layer, the contact layer provided on the first phase adjustment layer, a second phase adjustment layer provided on the contact layer and a wavelength adjustment layer provided on the second phase adjustment layer. The wavelength adjustment layer is formed by laminating a plurality of semiconductor films. A wavelength of light emitted from the surface emitting laser is determined based on a thickness of the wavelength adjustment layer.

According to yet another aspect of the invention, an atomic oscillator includes a surface emitting laser element; an alkali metal cell that encapsulates alkali metal; and a light detection unit that detects light transmitted through the alkali metal cell, the light being emitted from a surface emitting laser of the surface emitting laser element to the alkali metal cell. An oscillation frequency is controlled according to a light absorption characteristic of a quantum interference effect for two kinds of resonant lights, by injecting lights with two different wavelengths of lights including sidebands emitted from the surface emitting laser into the alkali metal cell. The surface emitting laser element includes plural surface emitting lasers, each of which includes a first reflection mirror provided on a semiconductor substrate; a resonator region including an active layer provided on the first reflection mirror; a second reflection mirror, including a plurality of low refraction index layers and a plurality of high refraction index layers, provided on the resonator region; a contact layer provided on the second reflection mirror; a third reflection mirror provided on the contact layer; an electric current narrowing layer provided between the active layer and the second reflection mirror or in the second reflection mirror; and a wavelength adjustment region provided between the second reflection mirror and the third reflection mirror. Optical lengths of at least one of thicknesses of the low refraction index layers and the high refraction index layers formed between the electric current narrowing layer and the contact layer are $(2N+1)\times\lambda/4$ ($N=1, 2, \ldots$), where $\lambda$ is a wavelength of light emitted from the surface emitting laser. The third reflection mirror is formed by alternately laminating films formed of dielectric materials, refraction indices of which are different from each other. The wavelength adjustment region includes a first phase adjustment layer, the contact layer provided on the first phase adjustment layer, a second phase adjustment layer provided on the contact layer and a wavelength adjustment layer provided on the second phase adjustment layer. The wavelength adjustment layer is formed by laminating a plurality of semiconductor films. A wavelength of light emitted from the surface emitting laser is determined based on a thickness of the wavelength adjustment layer.

According to the present invention, in a vertical cavity surface emitting laser having an intracavity structure, by reducing a resistance in the laser a characteristic such as the maximum optical output is enhanced. Moreover, service life of the vertical cavity surface emitting laser can be made longer.

BEST MODE FOR CARRYING OUT THE INVENTION

Figure 1:
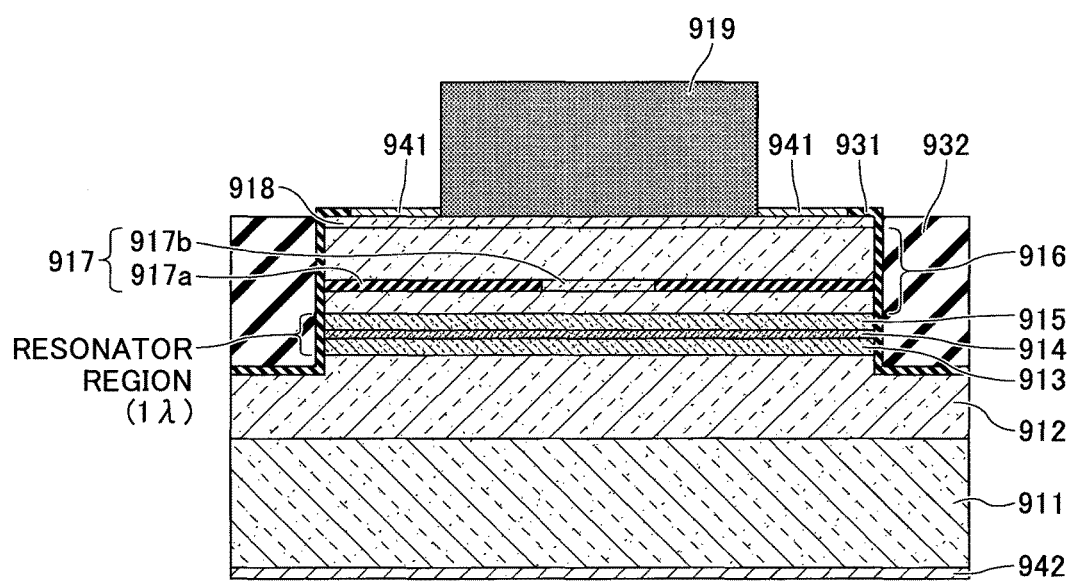
FIG. 1 is a cross-sectional diagram illustrating an example of a vertical cavity surface emitting laser element having an intracavity structure.

In the following, embodiments of the present invention will be described with reference to the accompanying drawings. Meanwhile, to the same members or the like, the same reference numerals are assigned and duplicate explanation is omitted.

First Embodiment

At first, a vertical cavity surface emitting laser having an intracavity structure will be explained with reference to FIG. 1. In the vertical cavity surface emitting laser shown in FIG. 1, on a semiconductor substrate 911, a lower Bragg reflector 912, a lower spacer layer 913, an active layer 914, an upper spacer layer 915, a second upper Bragg reflector 916, a contact layer 918, and a first upper Bragg layer 919 are formed. The semiconductor substrate 911 is formed of n-GaAs, which is an n-type semiconductor. The lower Bragg reflector 912 is formed by laminating n-$Al_{0.1}Ga_{0.9}As$, a high refraction index layer, and an n-$Al_{0.9}Ga_{0.1}As$ low refraction index layer alternately. The lower spacer layer 913 is formed of $Al_{0.2}Ga_{0.8}As$, the active layer 914 is formed of GaInAs quantum well layer/GaInPAs barrier layer, and the upper spacer layer 915 is formed of $Al_{0.2}Ga_{0.8}As$. In this vertical cavity surface emitting laser, a resonator region which has an optical length of a wavelength is formed by the lower spacer layer 913, the active layer 914 and the upper spacer layer 915.

The second upper Bragg reflector 916 is formed by laminating a p-$Al_{0.1}Ga_{0.9}As$ high refraction index layer and a p-$Al_{0.9}Ga_{0.1}As$ low refraction index layer alternately. Meanwhile, in a part of the second upper Bragg reflector 916, an electric current narrowing layer 917 formed of an AlAs layer. The contact layer 918 is formed of $p^{++}$-GaAs.

On the semiconductor substrate 911, a mesa is formed by removing a part of the contact layer 918, the second upper Bragg reflector 916, the upper spacer layer 915, the active layer 914, the lower spacer layer 913 and the lower Bragg reflector 912, which are formed of a semiconductor material. On the contact layer 918 in the central part on an upper surface of the mesa a first upper Bragg reflector 919 is formed, and on the contact layer 918 around the first upper Bragg reflector 919 an upper electrode 941 is formed. The first upper Bragg reflector is formed by laminating a $TiO_2$ high refraction index layer and a $SiO_2$ low refraction index layer alternately. Moreover, on a back side of the semiconductor substrate 911 a lower electrode 942 is formed.

In the electric current narrowing layer 917 formed of an AlAs layer, a selective oxidization region 917a is formed by selectively oxidizing from the circumference of the mesa. A central region in the mesa which has not been selectively oxidized is an electric current narrowing region 917b. On a side surface of the mesa and on a region where the semiconductor material is removed upon forming the mesa, a protection film 931 formed of SiN is formed. On the protection film 931 in the region where the semiconductor material is removed upon forming the mesa, a polyimide layer 932 is formed.

The vertical cavity surface emitting laser having the above-described structure emits laser light when an electric current flows through semiconductor layers between the upper electrode 941 and the lower electrode 942. That is, an electric current flows through the semiconductor substrate 911, the lower Bragg reflector 912, the lower spacer layer 913, the active layer 914, the upper spacer layer 915, the second upper Bragg reflector 916 and the contact layer 918, which are between the upper electrode 941 and the lower electrode 942. In the vertical cavity surface emitting laser having the above-described intracavity structure, the upper Bragg reflector is formed by the first upper Bragg reflector 919 formed of a dielectric material and the second upper Bragg reflector 916 formed of the semiconductor material. Accordingly, a thickness of the second upper Bragg reflector 916, through which an electric current flows, is formed less than that of a normal surface emitting laser.

Figure 2A:
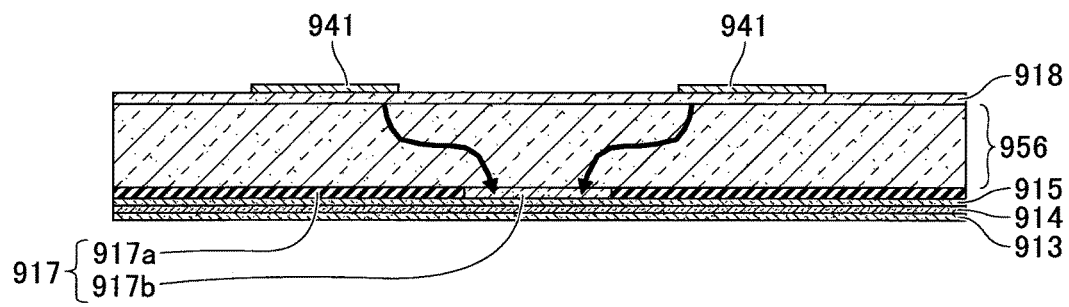
FIGS. 2A and 2B are explanatory diagrams illustrating an example of the vertical cavity surface emitting laser element.

Specifically, as shown in FIG. 2A, in a normal surface emitting laser which does not have the intracavity structure, a thick upper Bragg reflector 956 is formed between the upper spacer layer 915 and the contact layer 918. In a part of the upper Bragg reflector 956, an electric current narrowing layer 917 is formed. An electric current flowing in the surface emitting laser flows from the upper electrode 941 toward an electric current narrowing region 917b in the electric current narrowing layer 917.

Figure 2B:
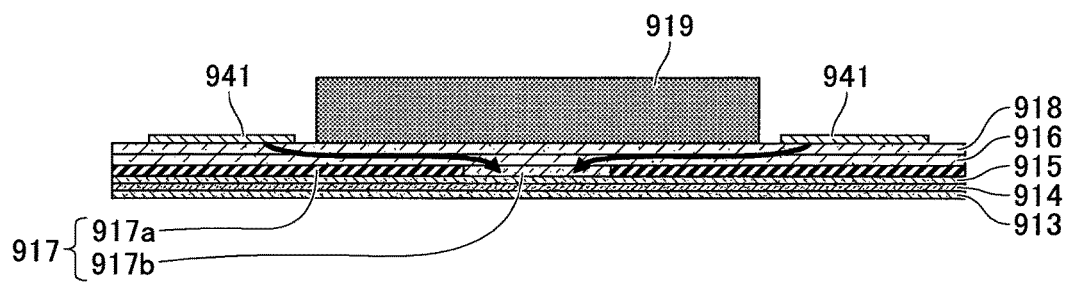

On the other hand, as shown in FIG. 2B, in the surface emitting laser having the intracavity structure, an electric current flowing in the surface emitting laser flows from the upper electrode 941 toward the electric current narrowing region 917b in the central part of the electric current narrowing layer 917 in the second upper Bragg reflector 916. Meanwhile, FIGS. 2A and 2B illustrate parts above the lower spacer layer 913 in the surface emitting lasers having the respective structures, and the semiconductor substrate 911, the lower Bragg reflector 912, the lower electrode 942 and the like are omitted.

In this way, a thickness between the upper electrode 941 and the electric current narrowing layer 917 in the surface emitting laser having the intracavity structure as shown in FIG. 2B is less than that in the surface emitting laser which does not have the intracavity structure as shown in FIG. 2A. Accordingly, a resistance between the upper electrode 941 and the electric current narrowing region 917b in the electric current narrowing layer 917 in the surface emitting laser having the intracavity structure as shown in FIG. 2B is greater than that in the surface emitting laser which does not have the intracavity structure as shown in FIG. 2A.

In this way, in the case where the resistance between the upper electrode 941 and the electric current narrowing region 917b in the electric current narrowing layer 917 becomes greater, the surface emitting laser generates heat, which may lower the maximum optical output, change a characteristic, or shorten service life of the surface emitting laser.

(Vertical Cavity Surface Emitting Laser)

Next, a vertical cavity surface emitting laser according to the present embodiment will be explained with reference to FIGS. 3 and 4. Meanwhile, FIG. 4 is a diagram illustrating a structure of a main part of the vertical cavity surface emitting laser according to the present embodiment. The vertical cavity surface emitting laser according to the present embodiment is a vertical cavity surface emitting laser having an intracavity structure which emits laser light with a wavelength of 980 nm. In the vertical cavity surface emitting laser according to the present embodiment, on a semiconductor substrate 11, a lower Bragg reflector 12, a lower spacer layer 13, an active layer 14, an upper spacer layer 15, a second upper Bragg reflector 16, a contact layer 18 and a first upper Bragg reflector 19 are formed. Meanwhile, in the present embodiment, the Bragg reflector is assumed to include a DBR (Distributed Bragg Reflector).

The semiconductor substrate 11 is formed of an n-GaAs substrate which is an n-type semiconductor. As shown in FIG. 4, the lower Bragg reflector 12 is formed by laminating 30.5 pairs of an n-GaAs high refraction index layer 51 having an optical film thickness of λ/4 and an n-AlAs low refraction index layer 52 alternately. The lower spacer layer 13 is formed of GaAs, the active layer 14 is formed of a GaInAs quantum well layer/a GaAs barrier layer, and the upper spacer layer 15 is formed of GaAs. In the surface emitting laser according to the present embodiment, a resonator region having an optical length of a wavelength is formed by the lower spacer layer 13, the active layer 14 and the upper spacer layer 15.

The second upper Bragg reflector 16 is formed by laminating 7 pairs of a p-$Al_{0.3}Ga_{0.7}As$ high refraction index layer 53 having an optical film thickness of λ/4 and a p-$Al_{0.7}Ga_{0.3}As$ low refraction index layer 54 alternately. Meanwhile, a reflection rate of the second upper Bragg reflector 16 formed as above is almost the same as that formed by laminating 3 pairs of a p-GaAs high refraction index layer having an optical film thickness of λ/4 and a p-AlAs low refraction index layer alternately, i.e. 99.75%. In the present embodiment, the second upper Bragg reflector 16 is formed so that x is greater than y where the low refraction index layer forming the second upper Bragg reflector 16 is denoted $Al_xGa_{1-x}As$ and the high refraction index layer is denoted $Al_yGa_{1-y}As$. Moreover, in a part of the second upper Bragg reflector 16, an electric current narrowing layer 17 formed of an AlAs layer is formed. The contact layer 18 is formed of $p^{++}$-GaAs. The electric current narrowing layer 17 may be formed inside the second upper Bragg reflector 16, or may be formed between the second upper Bragg reflector 16 and the active layer 14.

On the semiconductor substrate 11, a mesa is formed by removing a part of the contact layer 18, the second upper Bragg reflector 16, the upper spacer layer 15, the active layer 14, the lower spacer layer 13 and the lower Bragg reflector 12, which are formed of semiconductor materials. On the contact layer 18 in the central part on an upper surface of the mesa, the first upper Bragg reflector 19 is formed. On the contact layer 18 around the first upper Bragg reflector 19, an upper electrode 41 is formed. The first upper Bragg reflector 19 is formed by laminating 6 pairs of a $Ta_2O_5$ high refraction index layer 55 and a $SiO_2$ low refraction index layer 56 alternately. Moreover, on a back side of the semiconductor substrate 11, a lower electrode 42 is formed.

In the electric current narrowing layer 17 formed of an AlAs layer, a selective oxidization region 17a is formed by selectively oxidizing from the circumference of the mesa. A central region in the mesa which has not been selectively oxidized is an electric current narrowing region 17b. On a side surface of the mesa and on a region where the semiconductor material is removed upon forming the mesa, a protection film 31 formed of SiN is formed. On the protection film 31 in the region where the semiconductor material is removed upon forming the mesa, a polyimide layer 32 is formed.

(Manufacturing Method of Vertical Cavity Surface Emitting Laser)

Next, a manufacturing method of the vertical cavity surface emitting laser according to the present embodiment will be explained. At first, on the semiconductor substrate 11, semiconductor layers including the lower Bragg reflector 12, the lower spacer layer 13, the active layer 14, the upper spacer layer 15, the second upper Bragg reflector 16 and the contact layer 18 are formed by laminating. These semiconductor layers are formed by using the MOCVD (Metal Organic Chemical Vapor Deposition) method or the MBE (Molecular Beam Epitaxy) method.

Next, by applying photoresist on the contact layer 18, by exposing using an exposure device and by developing, a resist pattern (not shown) is formed in a region where the mesa is formed. After that, the semiconductor layers in a region where the resist pattern is not formed are removed by dry etching or the like until a side surface of the electric current narrowing layer 17 is exposed, and thereby the mesa is formed. On the side surface of the mesa formed as above, the side surface of the electric current narrowing layer 17 is exposed. A shape of the upper surface of the mesa formed as above, in the present embodiment, is a circle. The shape of the upper surface is not limited to a circle and may be an oval, a rectangle or an arbitrary shape.

Next, an AlAs film, which is the electric current narrowing layer 17 exposed on the side surface of the mesa, is treated with heat in steam, thereby oxidized from the circumference and $Al_xO_y$ is formed. Thus, the selective oxidization region 17a is formed. According to the above processing, a region in the electric current narrowing layer 17 which has not been selectively oxidized remains as the electric current narrowing region 17b, and thereby an electric current narrowing structure is formed.

Next, by forming a SiN film, the protection film 31 is formed. Then, the region where the semiconductor layers are removed by etching upon forming the mesa is filled with polyimide and planarized, and the polyimide layer 32 is formed.

Next, on the upper surface of the mesa, the protection film 31 and the polyimide layer 32 in the central part, which becomes a light emitting region, and in a region where the upper electrode 41 will be formed are removed, and the contact layer 18 is exposed. After that, on the upper surface of the mesa, the upper electrode 41 which becomes a p-side individual electrode is formed so as to surround the light emitting region. On the back side of the semiconductor substrate 11, the lower electrode 42 which becomes an n-side common electrode is formed.

Next, on the upper surface of the mesa, by laminating 6 pairs of the $Ta_2O_5$ high refraction index layer 55 and the $SiO_2$ low refraction index layer 56 alternately on the contact layer 18 in the central part, which becomes the light emitting region, by using the electron beam evaporation method, the first upper Bragg reflector 19 is formed.

The semiconductor apparatus according to the present embodiment emits laser light from an opposite side of the semiconductor substrate 11. In the present embodiment, since the protection film 31 formed of SiN protects a side surface and a bottom surface of the layer including easily corrosive Al which was exposed by etching upon forming the mesa, reliability can be improved.

(Effect)

Next, an effect of the vertical cavity surface emitting laser according to the present embodiment will be explained. In the vertical cavity surface emitting laser according to the present embodiment, the second upper Bragg reflector 16 is formed by laminating 7 pairs of the p-$Al_{0.3}Ga_{0.7}As$ high refraction index layer 53 having an optical film thickness of $\lambda/4$ and the p-$Al_{0.7}Ga_{0.3}As$ low refraction index layer 54 alternately. Accordingly, in the present embodiment, by reducing a difference between the refraction indices of the high refraction index layer and the low refraction index layer forming the second upper Bragg reflector 16, the number of laminated pairs is increased from 3 to 7.

Figure 5:
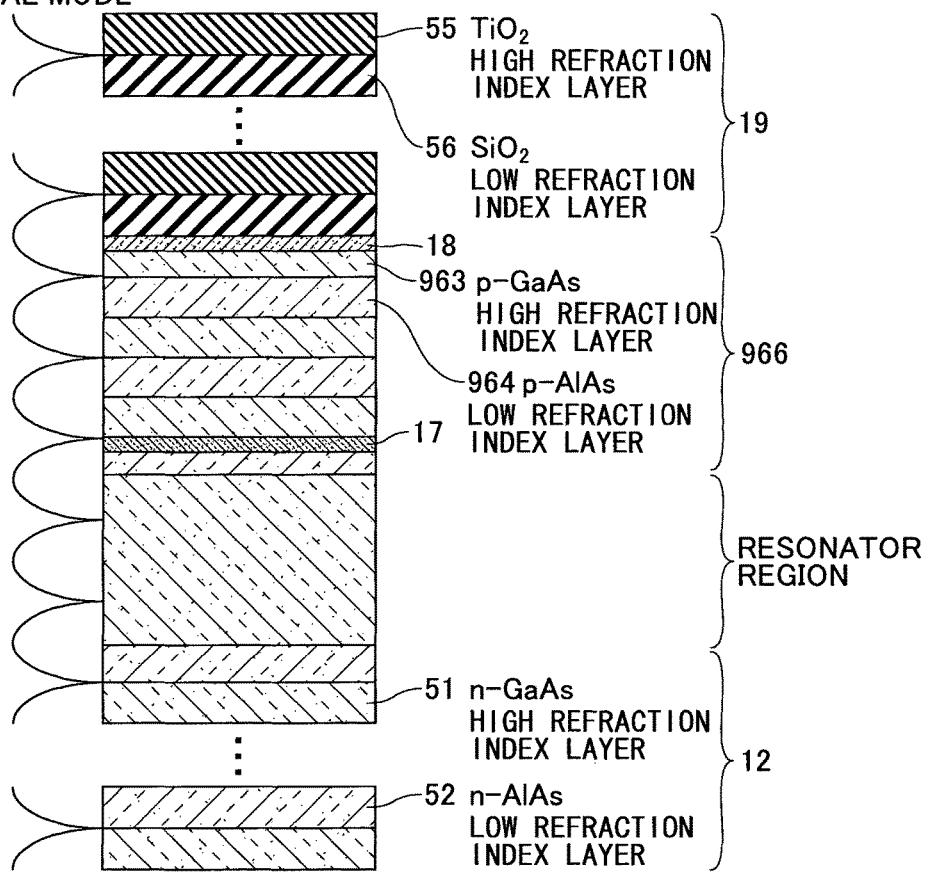
FIG. 5 is an explanatory diagram illustrating a vertical cavity surface emitting laser element having a normal intracavity structure.

Specifically, in a surface emitting laser having a normal intracavity structure, as shown in FIG. 5, the second upper Bragg reflector 966 is formed by laminating 3 pairs of the p-GaAs high refraction index layer 963 having an optical film thickness of $\lambda/4$ and the p-AlAs low refraction index layer 964 alternately. The reflection rate of the second upper Bragg reflector 966 formed as above is 99.75%. In order to obtain a reflection rate comparable with the above reflection rate for the second upper Bragg reflector 16 in the vertical cavity surface emitting laser according to the present embodiment, 7 pairs of the p-$Al_{0.3}Ga_{0.7}As$ high refraction index layer 53 having an optical film thickness of $\lambda/4$ and the p-$Al_{0.7}Ga_{0.3}As$ low refraction index layer 54 are required.

Figure 3:
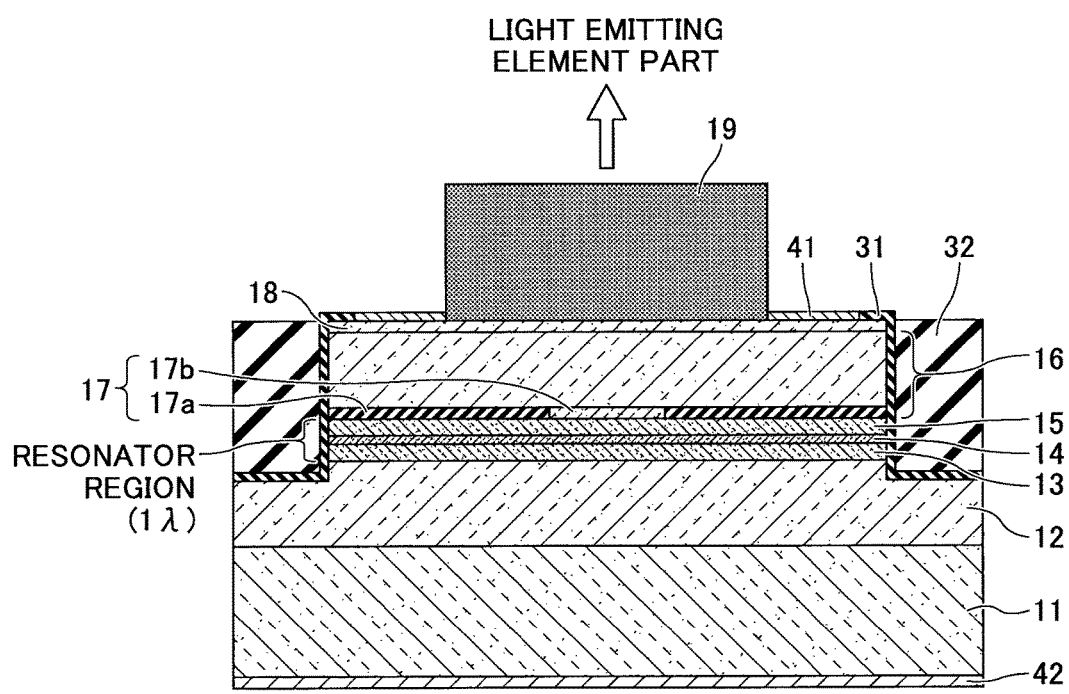
FIG. 3 is a cross-sectional diagram illustrating an example of a vertical cavity surface emitting laser element according to a first embodiment.
Figure 4:
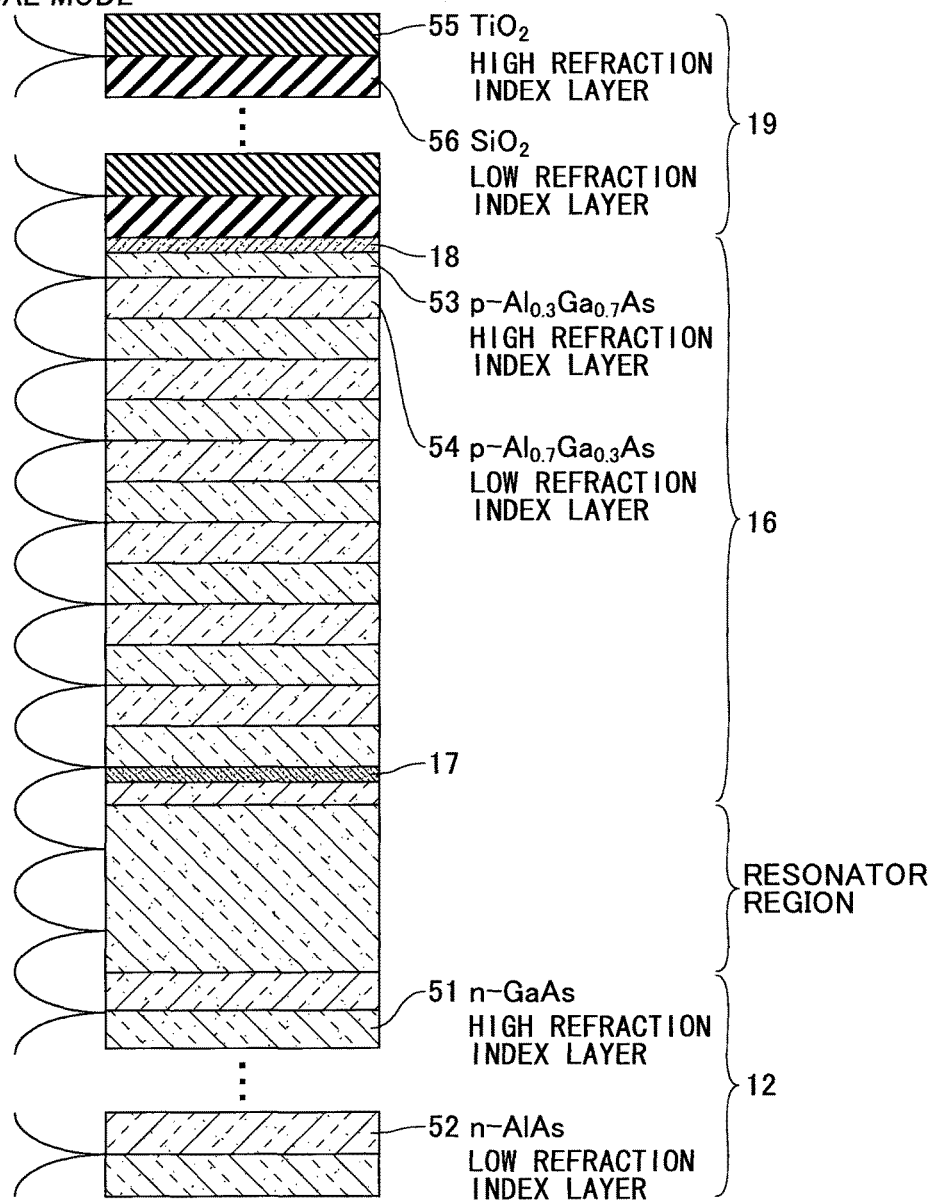
FIG. 4 is an explanatory diagram illustrating an example of the vertical cavity surface emitting laser element according to the first embodiment.

In the present embodiment, by increasing the number of pairs, as described above, the optical film thickness between the electric current narrowing layer 17 and the contact layer 18 can be increased from 1.25l, as shown in FIG. 5, to 3.25l. In this way, by increasing the optical film thickness between the electric current narrowing layer 17 and the contact layer 18, a cross-sectional area of an electric current path can be made greater, and thereby the electric resistance can be reduced. On this occasion, since the reflection rate on the Bragg reflector is not changed, an element characteristic of a threshold current or slope efficiency is not influenced.

Generally, in a vertical cavity surface emitting laser having a normal structure, the difference between refraction indices of a high refraction index layer and a low refraction index layer forming a Bragg reflector is preferably greater. This is because when the refraction index difference is small, the number of pairs of the high refraction index layer and the low refraction index layer forming the Bragg reflector increases, the electric resistance increases due to band discontinuity, and a characteristic is degraded. Meanwhile, there is an upper limit for the refraction index difference so as not to increase inter-band light absorption.

In a vertical cavity surface emitting laser having an intracavity structure according to the present embodiment, the refraction index difference between the high refraction index layer and the low refraction index layer forming the Bragg reflector is reduced and the number of pairs is increased in order to solve the problem of the high electric resistance due to the narrow electric current path. Then, the electric current path becomes wider and the electric resistance is reduced. Accordingly, in the present embodiment, a composition difference between the high refraction index layer and the low refraction index layer forming the Bragg reflector is reduced in order to reduce the refraction index difference.

Figure 6:
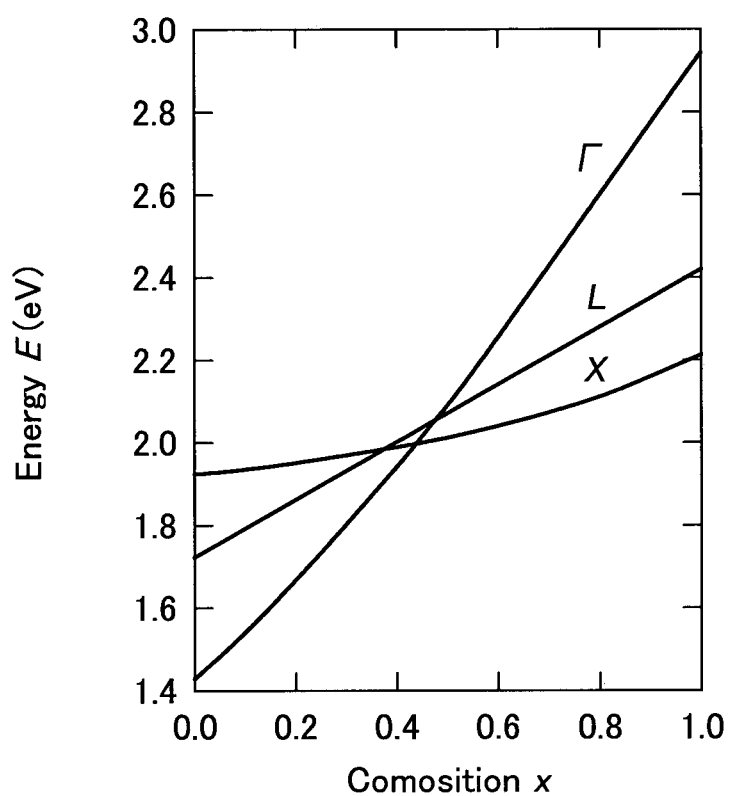
FIG. 6 is a correlation diagram illustrating an example of a correlation between a composition ratio of Al in AlGaAs and band energy according to the present embodiment.

In general, for a material such as AlGaAs, when the composition difference becomes greater, the refraction index difference increases and a band gap difference also increases. Here, a band gap of $Al_{0.3}Ga_{0.7}As$ at 300 K is 1.78 eV, a band gap of $Al_{0.7}Ga_{0.3}As$ is 2.05 eV, and a difference between the band gaps is 0.27 eV. Moreover, the refraction index of $Al_{0.3}Ga_{0.7}As$ for the wavelength of 885.7 nm is 3.394, the refraction index of $Al_{0.7}Ga_{0.3}As$ is 3.162, and the refraction index difference is 0.232. Accordingly, in the present embodiment, the band gap difference is preferably less than or equal to 0.27 eV, and the refraction index difference is preferably less than or equal to 0.232. Meanwhile, FIG. 6 illustrates band energy of $Al_xGa_{1-x}As$ in the case where x is changed (See non-patent document 5). FIG. 6 shows that an electron exists at $\Gamma$ point where x is greater than 0 and less than 0.5, and an electron exists at X point where x is greater than 0.5 and less than 1.

Moreover, the electric resistance can be further reduced by further reducing the refraction index difference between the high refraction index layer and the low refraction index layer forming the Bragg reflector and further increasing the number of pairs. However, in this case, the Bragg reflector becomes easily affected by optical absorption due to dopants, and an adverse effect such as a decrease in the slope efficiency may occur. Accordingly, the refraction index difference preferably does not become too small.

Second Embodiment

Next, a second embodiment of the present invention will be explained. The present embodiment describes a vertical cavity surface emitting laser element in which vertical cavity surface emitting lasers emitting laser lights, wavelengths of which are different from each other around 894.6 nm, are formed.

Figure 7:
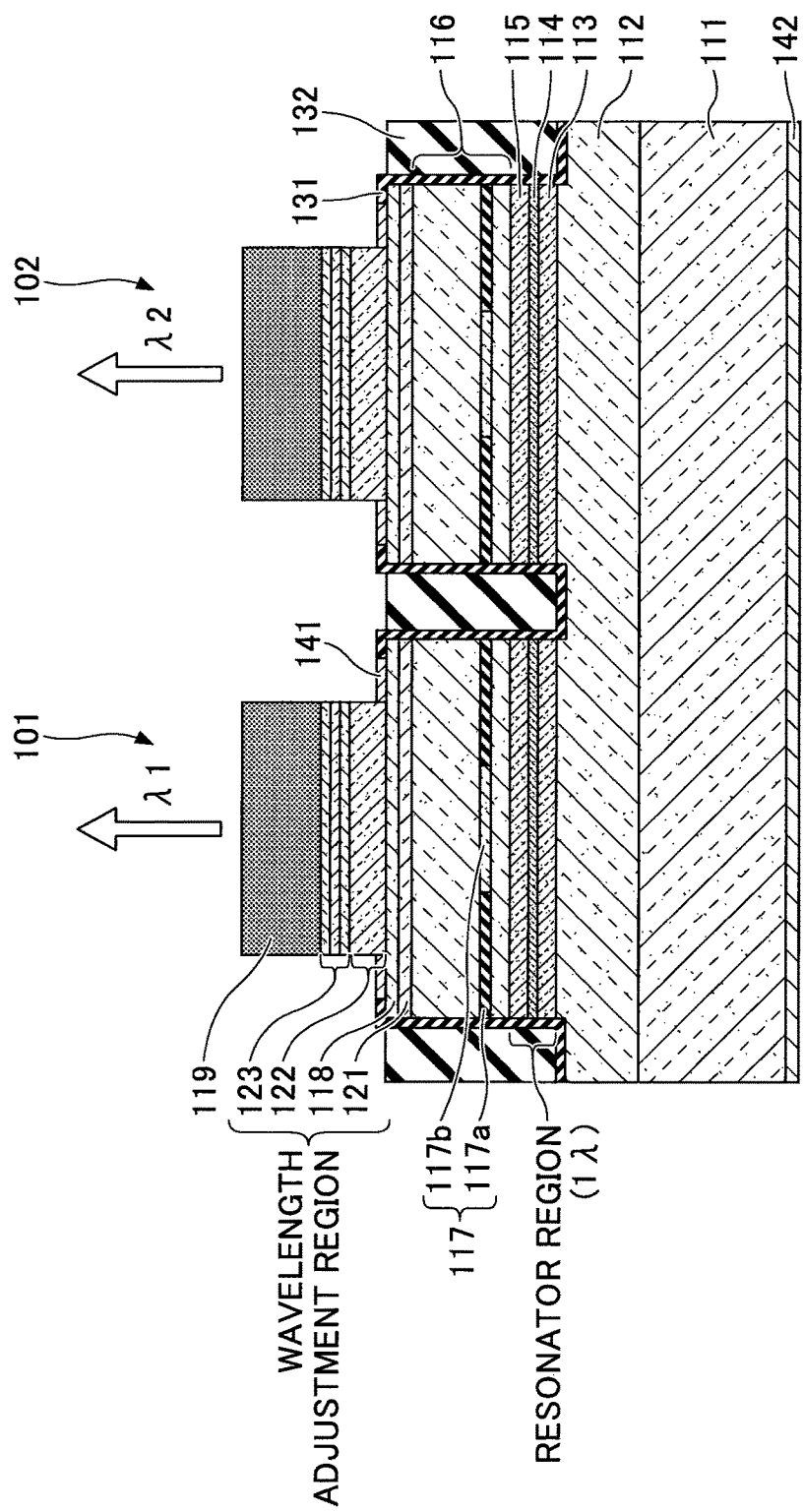
FIG. 7 is a cross-sectional diagram illustrating an example of a vertical cavity surface emitting laser element according to a second embodiment.
Figure 8:
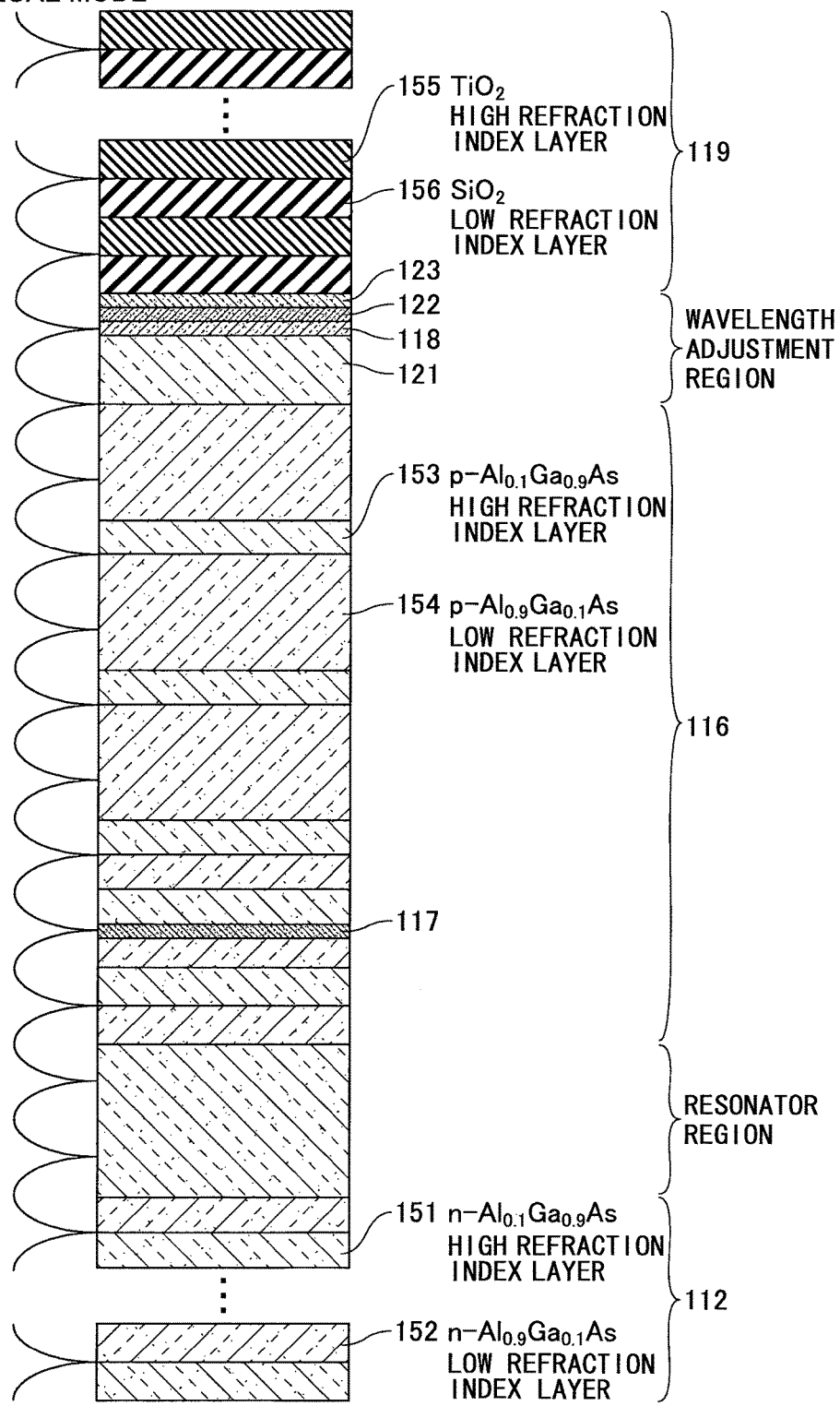
FIG. 8 is an explanatory diagram illustrating an example of the vertical cavity surface emitting laser element according to the second embodiment.
Figure 9:
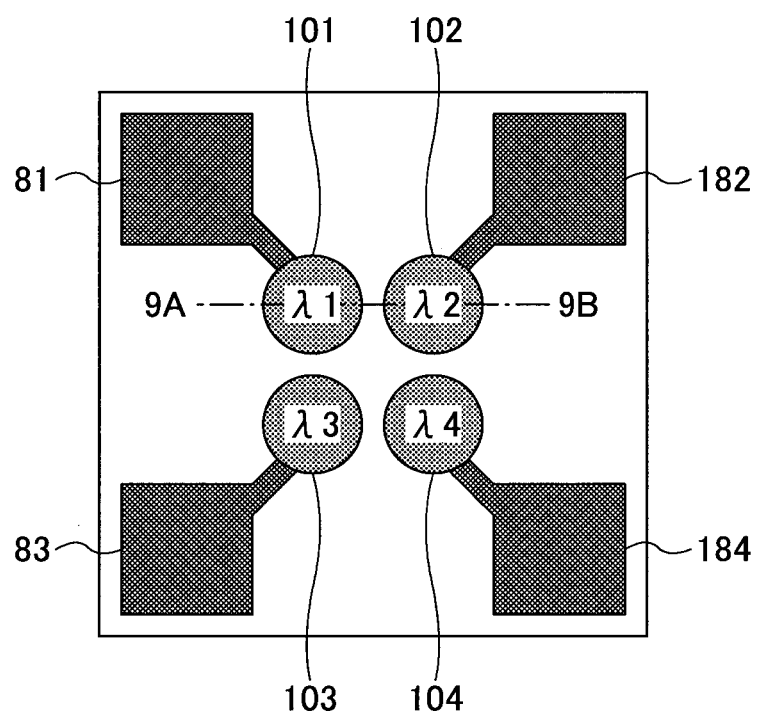
FIG. 9 is a top view illustrating an example of the vertical cavity surface emitting laser element according to the second embodiment.

The vertical cavity surface emitting laser element according to the present embodiment will be explained with reference to FIGS. 7 to 9. Meanwhile, FIG. 8 is a diagram illustrating a structure of a main section of the vertical cavity surface emitting laser element according to the present embodiment. FIG. 9 is a top view of the vertical cavity surface emitting laser element according to the present embodiment. Meanwhile, FIG. 7 is a cross-sectional diagram cut along a dot-dashed line 9A-9B in FIG. 9.

In the vertical cavity surface emitting laser element according to the present embodiment, for example, as shown in FIG. 9, vertical cavity surface emitting lasers that can emit laser lights of 4 channels are formed on a chip 300 μm square.

In the vertical cavity surface emitting laser element according to the present embodiment, on a semiconductor substrate 111, a lower Bragg reflector 112, a lower spacer layer 113, an active layer 114, an upper spacer layer 115, a second upper Bragg reflector 116, a second phase adjustment layer 121 and a contact layer 118 are formed. On the contact layer 118, a first phase adjustment layer 122, a wavelength adjustment layer 123 and a first upper Bragg reflector 119 are formed. In the present embodiment, a wavelength adjustment region is formed by the second phase adjustment layer 121, the contact layer 118, the first phase adjustment layer 122 and the wavelength adjustment layer 123. The wavelength adjustment region according to the present embodiment functions as one of high refraction index layers in the second upper Bragg reflector 116.

In the present embodiment, a number of layers (total thickness) of the wavelength adjustment layer 123 in the wavelength adjustment region between the first upper Bragg reflector 119 and the second upper Bragg reflector 116 differs from one channel to another, thereby plural vertical cavity surface emitting lasers with different oscillation wavelengths are formed in a chip. That is, plural semiconductor films are laminated in the wavelength adjustment layer 123. By removing the semiconductor films from one layer to the next, the optical film thickness of the wavelength adjustment layer 123 is changed and the oscillation wavelength of laser light varies.

In the present embodiment, as shown in FIG. 9, four vertical cavity surface emitting lasers 101, 102, 103 and 104 that emit laser lights with four different wavelengths $\lambda 1$, $\lambda 2$, $\lambda 3$ and $\lambda 4$, respectively, are formed. Meanwhile, an upper electrode of the vertical cavity surface emitting laser 101 is connected to an electrode pad 181, an upper electrode of the vertical cavity surface emitting laser 102 is connected to an electrode pad 182, an upper electrode of the vertical cavity surface emitting laser 103 is connected to an electrode pad 183, and an upper electrode of the vertical cavity surface emitting laser 104 is connected to an electrode pad 184.

The semiconductor substrate 111 is formed of an n-GaAs substrate which is an n-type semiconductor. As shown in FIG. 8, the lower Bragg reflector 112 is formed by laminating 35.5 pairs of an n-$Al_{0.1}Ga_{0.9}As$ high refraction index layer 151 having an optical film thickness of $\lambda/4$ and an n-$Al_{0.9}Ga_{0.1}As$ low refraction index layer 152 alternately. The lower spacer layer 113 is formed of $Al_{0.2}Ga_{0.8}As$, the active layer 114 is formed of a GaInAs quantum well layer/a GaInPAs barrier layer, and the upper spacer layer 115 is formed of $Al_{0.2}Ga_{0.8}As$. In the surface emitting laser according to the present embodiment, a resonator region having an optical length of a wavelength is formed by the lower spacer layer 113, the active layer 114 and the upper spacer layer 115.

The second upper Bragg reflector 116 is formed by laminating 5 pairs of a p-$Al_{0.1}Ga_{0.9}As$ high refraction index layer 153 having an optical film thickness of $\lambda/4$ and a p-$Al_{0.9}Ga_{0.1}As$ low refraction index layer 154 alternately. In the present embodiment, the second upper Bragg reflector 116 is formed so that x is greater than y where the low refraction index layer forming the second upper Bragg reflector 116 is denoted $Al_xGa_{1-x}As$ and the high refraction index layer is denoted $Al_yGa_{1-y}As$. Meanwhile, in the second upper Bragg reflector 116, the low refraction index layer of the second pair from the resonator region is formed by an electric current narrowing layer 117 formed of an AlAs layer. In the electric current narrowing layer 117 formed of the AlAs layer, a selective oxidization region 117a is formed by selectively oxidizing from a circumference of a mesa. A central region in the mesa which has not been selectively oxidized is an electric current narrowing region 117b.

Moreover, in the second upper Bragg reflector 116, the p-$Al_{0.9}Ga_{0.1}As$ low refraction index layers 154 in 3 pairs above the electric current narrowing layer 117 are formed so that the optical film thickness of each layer is $3\lambda/4$. The optical film thickness of the other layers is $\lambda/4$. The contact layer 118 is formed of $p^{++}$-GaAs.

The second phase adjustment layer 121 is formed of p-$Al_{0.1}Ga_{0.9}As$ and the first phase adjustment layer 122 is formed of GaInP. The wavelength adjustment layer 123 is formed of laminated GaAsP film, GaInP film and GaAsP film. A film thickness of the wavelength adjustment layer 123 in each vertical cavity surface emitting laser is changed by removing the films from one layer to the next. Meanwhile, the optical film thickness per one layer of the laminated GaAsP film, GaInP film and GaAsP film forming the wavelength adjustment layer is 8 nm. In the present embodiment, the wavelength adjustment layer 123 is formed so that an optical film thickness from a lower end of the second phase adjustment layer 121 to a center of the central GaInP film in the wavelength adjustment layer 123 is $3\lambda/4$. Meanwhile, in the present embodiment, GaAsP will be called a first wavelength adjustment material and GaInP will be called a second wavelength adjustment material in the following. Moreover, etching solution for removing the first wavelength adjustment material will be called a first etchant and etching solution for removing the second wavelength adjustment material will be called a second etchant in the following. Moreover, the first wavelength adjustment material may be GaAs.

On the semiconductor substrate 111, a mesa is formed by removing a part of the contact layer 118, the second phase adjustment layer 121, the second upper Bragg reflector 116, the upper spacer layer 115, the active layer 114, the lower spacer layer 113, the lower Bragg reflector 112 and the like. On the contract layer 118 in the central part on an upper surface of the mesa, the first phase adjustment layer 122, the wavelength adjustment layer 123 and the first upper Bragg reflector 119 are formed by being laminated. Moreover, on the contact layer 118 in a surrounding area around the central part, on which the first phase adjustment layer 122, the wavelength adjustment layer 123 and the first upper Bragg reflector 119 are formed by being laminated, an upper electrode 141 is formed.

The first upper Bragg reflector 119 is formed by laminating 8.5 pairs of a $TiO_2$ high refraction index layer 155 and a $SiO_2$ low refraction index layer 156 alternately. Moreover, on a back side of the semiconductor substrate 111, a lower electrode 142 is formed.

In the present embodiment, the four vertical cavity surface emitting lasers are made with oscillation wavelengths which are different from each other, by removing the laminated GaAsP film, GaInP film and GaAsP film forming the wavelength adjustment layer 123 from one layer to the next. As described above, since the optical film thickness per one layer of the laminated GaAsP film, GaInP film and GaAsP film forming the wavelength adjustment layer 123 is 8 nm, an interval of the oscillation wavelength of each of the vertical cavity surface emitting lasers is 1.4 nm.

Moreover, in the present embodiment, by adjusting the optical film thickness of the second phase adjustment layer 121 and arranging the contact layer 118 at a mode node position, the characteristic can be enhanced. Moreover, by adjusting the optical film thickness of the first phase adjustment layer 122 and arranging the center of the GaInP film in the wavelength adjustment layer 123 at a mode antinode position, a change in the characteristic in each wavelength channel can be avoided. Meanwhile, a material forming the wavelength adjustment region has almost the same refraction index as that of the p-$Al_{0.1}Ga_{0.9}As$ high refraction index layer 153 in the second upper Bragg reflector 116. Accordingly, the present embodiment has a configuration in which the p-$Al_{0.1}Ga_{0.9}As$ high refraction index layer 153 in the second upper Bragg reflector 116 is replaced by the wavelength adjustment region.

(Manufacturing Method of Vertical Cavity Surface Emitting Laser Element)

Next, a manufacturing method of the vertical cavity surface emitting laser element according to the present embodiment will be explained. At first, on the semiconductor substrate 111, semiconductor layers including the lower Bragg reflector 112, the lower spacer layer 113, the active layer 114, the upper spacer layer 115, the second upper Bragg reflector 116 and the wavelength adjustment region are formed by laminating. These semiconductor layers including the lower Bragg reflector 112, the lower spacer layer 113, the active layer 114, the upper spacer layer 115, the second upper Bragg reflector 116 and the wavelength adjustment region are formed by using the MOCVD method or the MBE method.

The wavelength adjustment layers 123 of the vertical cavity surface emitting lasers have numbers of layers of the wavelength adjustment layers 123 different from each other and have film thicknesses different from each other made by performing photolithography and selective etching, respectively. For example, upon performing etching for the GaPAs film (and also for the GaAs film), a mixture of sulfuric acid, hydrogen peroxide and water can be used. Upon performing etching for the GaInP film, a mixture of hydrochloric acid and water can be used.

Moreover, in order to form the upper electrode 141 on the contact layer 118 around the first upper Bragg reflector 119 or the like, which will be described later, the wavelength adjustment layer 123 and the first phase adjustment layer 122 around the first upper Bragg reflector 119 or the like are removed and the contact layer 118 is exposed.

Next, by applying photoresist on the contact layer 118 and the wavelength adjustment layer 123, by exposing using an exposure device and by developing, a resist pattern (not shown) is formed in a region where the mesa is formed. After that, the semiconductor layers in a region where the resist pattern is not formed are removed by dry etching or the like until a side surface of the electric current narrowing layer 117 is exposed; thereby the mesa is formed. On the side surface of the mesa formed as above, the side surface of the electric current narrowing layer 117 is exposed. A shape of the upper surface of the mesa formed as above, in the present embodiment, is a circle. The shape of the upper surface is not limited to a circle and may be an oval, a rectangle or an arbitrary shape.

Next, an AlAs film, which is the electric current narrowing layer 117 exposed on the side surface of the mesa, is treated with steam heat, is thereby oxidized from the circumference and $Al_xO_y$ is formed. Thus, the selective oxidization region 117a is formed. A region in the electric current narrowing layer 117 which has not been selectively oxidized remains as the electric current narrowing region 117b; thereby an electric current narrowing structure is formed in each of the vertical cavity surface emitting lasers.

Next, by forming a SiN film, the protection film 131 is formed. Then, the region where the semiconductor layers are removed by etching upon forming the mesa is filled with polyimide and planarized, and the polyimide layer 132 is formed.

Next, on the upper surface of the mesa, the protection film 131 and the polyimide layer 132 in the central part, which becomes a light emitting region, and in a region where the upper electrode 141 will be formed are removed, and the contact layer 118 and the wavelength adjustment layer 123 are exposed. After that, on the upper surface of the mesa, the upper electrode 141 which becomes a p-side individual electrode is formed so as to surround the light emitting region. On the back side of the semiconductor substrate 111, the lower electrode 142 which becomes an n-side common electrode is formed.

Next, on the upper surface of the mesa, by laminating 8.5 pairs of the $TaO_2$ high refraction index layer 155 and the $SiO_2$ low refraction index layer 156 alternately on the wavelength adjustment layer 123 in the central part, which becomes the light emitting region, by using the electron beam evaporation method, the first upper Bragg reflector 119 is formed.

The semiconductor apparatus according to the present embodiment emits laser light from an opposite side of the semiconductor substrate 111. In the present embodiment, since the protection film 131 formed of SiN protects a side surface and a bottom surface of the layer including easily corrosive Al which was exposed by etching upon forming the mesa, reliability can be improved.

(Effect)

Next, an effect of the vertical cavity surface emitting laser according to the present embodiment, which is formed so that the optical film thickness of the p-$Al_{0.9}Ga_{0.1}As$ low refraction index layers 154 in 3 pairs above the electric current narrowing layer 117 formed in the second upper Bragg reflector 116 is $3\lambda/4$, will be explained.

Figure 10:
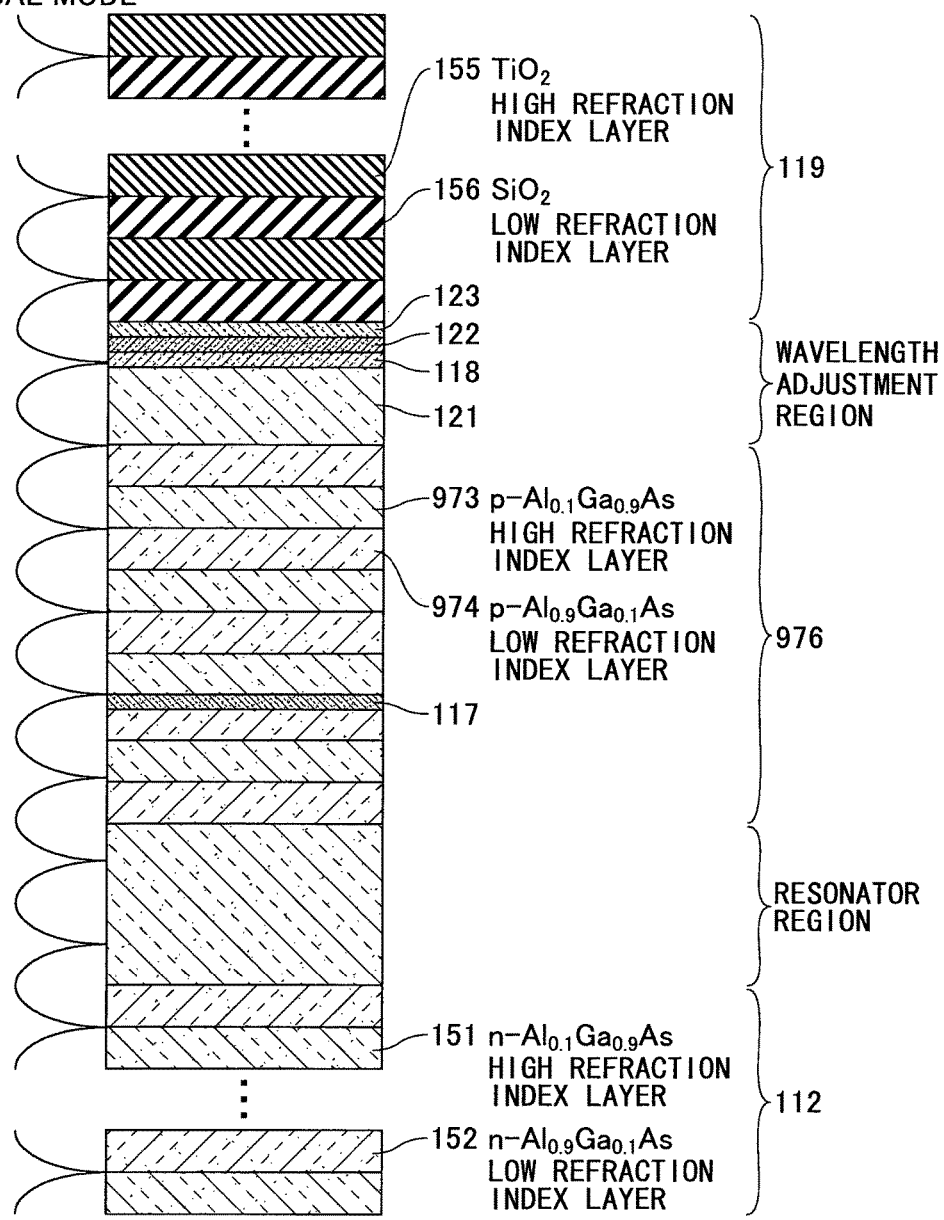
FIG. 10 is an explanatory diagram illustrating an example of a vertical cavity surface emitting laser element having the intracavity structure including a wavelength adjustment region according to the present embodiment.

FIG. 8 illustrates a part of the structure of the vertical cavity surface emitting laser according to the present embodiment. The vertical cavity surface emitting laser element is formed so that the optical film thickness of the p-$Al_{0.9}Ga_{0.1}As$ low refraction index layers 154 in 3 pairs above the electric current narrowing layer 117 in the second upper Bragg reflector 116 is $3\lambda/4$. On the other hand, FIG. 10 illustrates a part of the structure of the vertical cavity surface emitting laser, which is formed so that an optical film thickness of the p-$Al_{0.1}Ga_{0.9}As$ high refraction index layer 973 and an optical film thickness of the p-$Al_{0.9}Ga_{0.1}As$ low refraction index layer 974 in the second upper Bragg reflector 976 are $\lambda/4$.

Figure 11:
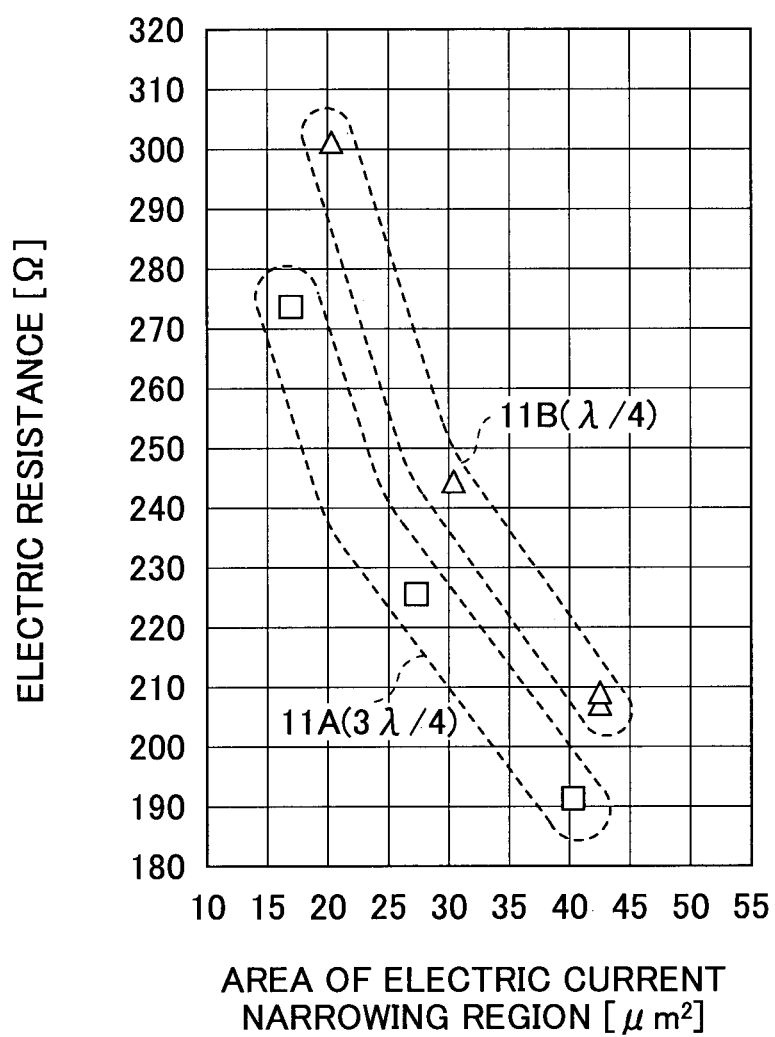
FIG. 11 is a correlation diagram illustrating an example of a correlation between an area of an electric current narrowing region and electric resistance in an electric current narrowing layer according to the present embodiment.

FIG. 11 illustrates a relation of an area of the electric current narrowing region 117b in the electric current narrowing layer 117 and an electric resistance between the upper electrode 141 and the lower electrode 142. In FIG. 11, a region 11A shows a characteristic of the vertical cavity surface emitting laser according to the present embodiment, as shown in FIG. 8. A region 11B shows a characteristic of the vertical cavity surface emitting laser having the structure as shown in FIG. 10. FIG. 11 shows that in the case where the areas of the electric current narrowing regions 117b in the electric current narrowing layers 117 are the same, the electric resistance of the vertical cavity surface emitting laser according to the present embodiment shown in FIG. 8 is less than that of the vertical cavity surface emitting laser having the structure shown in FIG. 10. That is, by increasing the thickness of the low refraction index layer above the electric current narrowing layer in the second upper Bragg reflector from $\lambda/4$ to $3\lambda/4$, the electric resistance can be reduced. Meanwhile, even if the optical film thickness of the p-$Al_{0.9}Ga_{0.1}As$ low refraction index layer in the second upper Bragg reflector is increased from $\lambda/4$ to $3\lambda/4$ per one layer, the reflection rate on the second upper Bragg reflector is not changed. Therefore, a characteristic of a threshold current or slope efficiency is not changed. Furthermore, in the present embodiment, even if the optical film thickness of the p-$Al_{0.9}Ga_{0.1}As$ low refraction index layer in the second upper Bragg reflector is increased from $\lambda/4$ to $3\lambda/4$ per one layer, a mode intensity of the wavelength adjustment layer 123 is not changed. Accordingly, the relation between the film thickness of each layer in the wavelength adjustment layer 123 and a wavelength interval in the wavelength adjustment layer 123 is not changed, and this relation is not affected even when the vertical cavity surface emitting laser element including plural vertical cavity surface emitting lasers, wavelength of which are different from each other, is manufactured.

Figure 12:
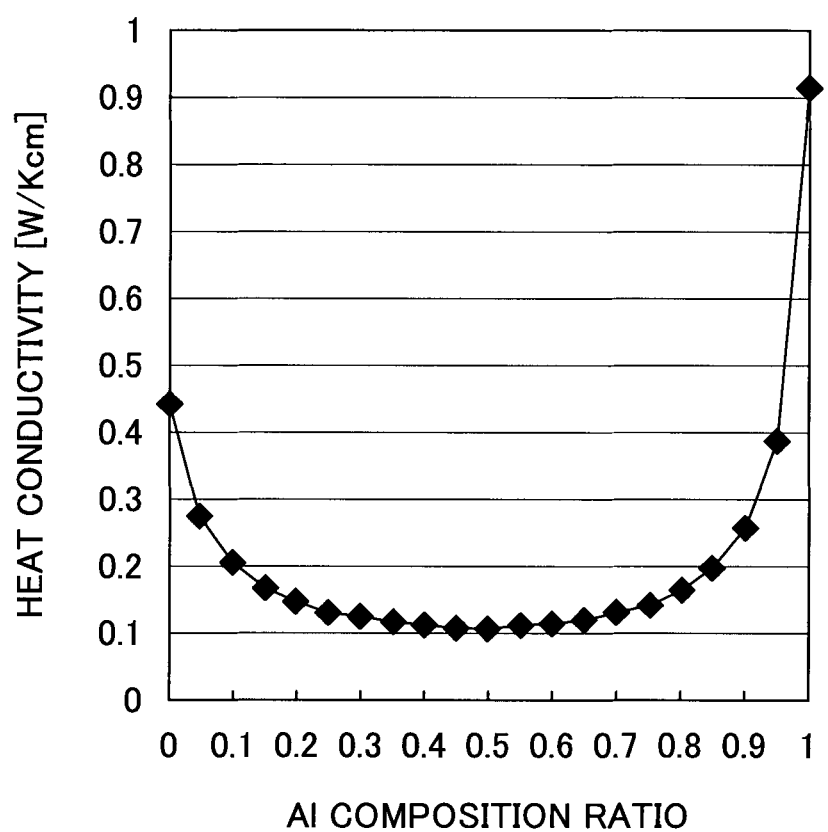
FIG. 12 is a correlation diagram illustrating an example of a correlation between the composition ratio of Al in AlGaAs and heat conductivity according to the present embodiment.

Furthermore, the vertical cavity surface emitting laser element according to the present embodiment has a feature in a heat radiation effect. FIG. 12 illustrates a relation between a composition ratio of Al in AlGaAs and heat conductivity. The head conductivity of $Al_{0.9}Ga_{0.1}As$ where the Al composition ratio is 0.9 is greater than that of $As_{0.7}Ga_{0.3}As$ where the Al composition ratio is 0.7. Accordingly, since the vertical cavity surface emitting laser element according to the present embodiment has a feature that the electric resistance is reduced and the heat conductivity is great, a temperature of the active layer 114 can be lowered and service life can be made longer.

Meanwhile, the vertical cavity surface emitting laser according to the present embodiment has a junction-up structure in which bonding is performed on the side of the semiconductor substrate 111 which is opposite to the semiconductor p-n junction side. However, in a junction-down structure in which the bonding is performed on the semiconductor p-n junction side, the bonding is performed on the low resistant layer side and the above described effect becomes greater.

Moreover, by increasing the optical film thickness of the p-$Al_{0.9}Ga_{0.1}As$ low refraction index layer 154 to $3\lambda/4$, as in the present embodiment, a band gap of the material becomes wider, a potential barrier becomes smaller and the electric resistance can be reduced.

Furthermore, in the present embodiment, the optical film thickness of the p-$Al_{0.9}Ga_{0.1}As$ low refraction index layer 154 in the second upper Bragg reflector 116 may be greater than $3\lambda/4$, i.e. $(2N+1)\times\lambda/4$ ($N=2, 3, \ldots$). Moreover, each of a part (one or more) of the p-$Al_{0.9}Ga_{0.1}As$ low refraction index layers 154 may have the greater optical film thickness, or all of the p-$Al_{0.9}Ga_{0.1}As$ low refraction index layers 154 may have the greater optical film thickness. However, when doping adjustment for each layer is not sufficient, it becomes easily affected by optical absorption and an adverse effect such as a decrease in the slope efficiency may occur. Accordingly, N is preferably small.

Third Embodiment

Next, a third embodiment of the present invention will be explained. The present embodiment describes a vertical cavity surface emitting laser element in which vertical cavity surface emitting lasers emitting laser lights, wavelengths of which are different from each other around 894.6 nm, are formed.

The vertical cavity surface emitting laser element according to the present embodiment will be explained with reference to FIG. 13. The vertical cavity surface emitting laser element according to the present embodiment has a structure in which the thickness of the p-$Al_{0.1}Ga_{0.9}As$ high refraction index layer 153 formed in the second upper Bragg reflector 116 is great. Meanwhile, FIG. 13 is a diagram illustrating a structure of a main section of the vertical cavity surface emitting laser element according to the present embodiment.

Figure 13:
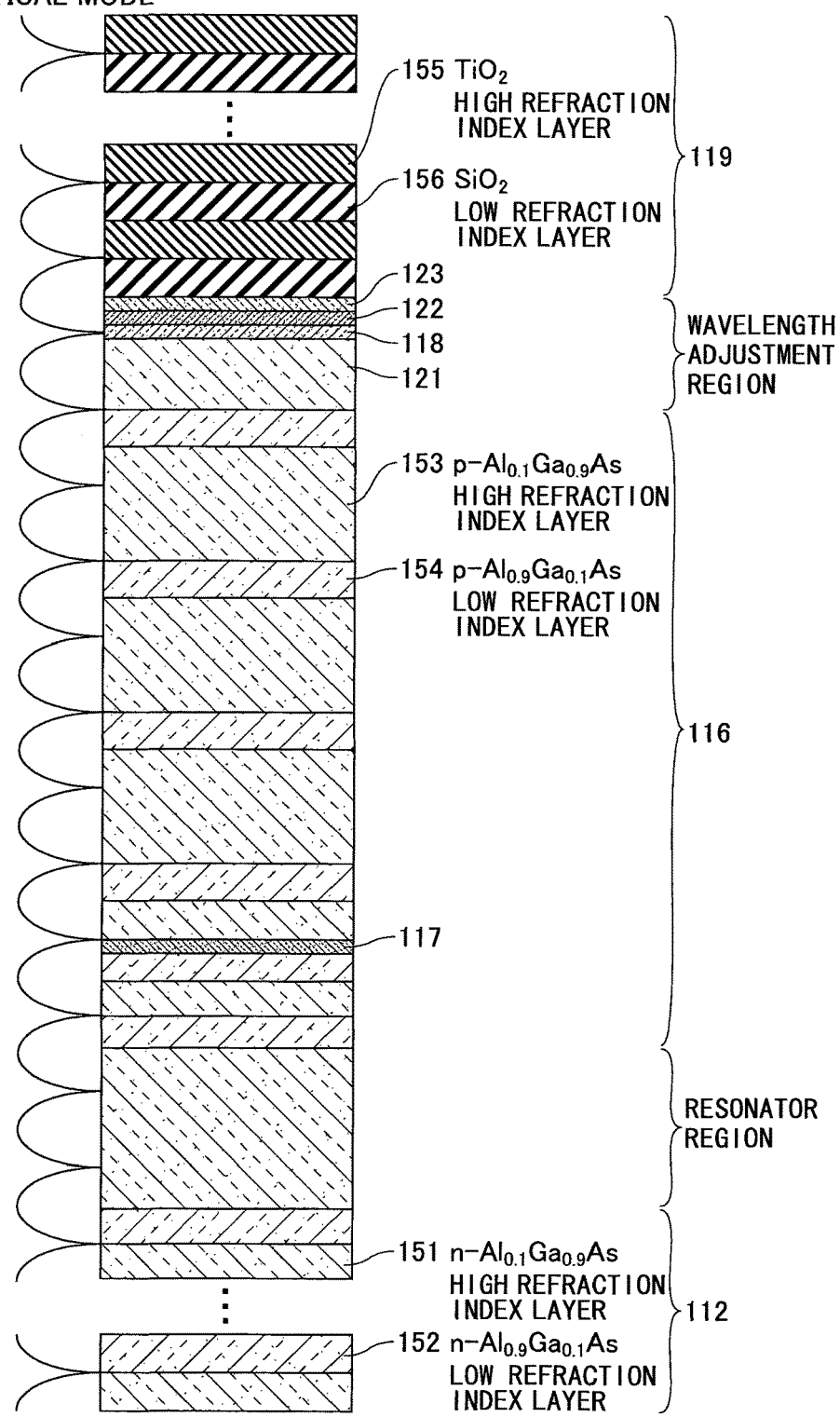
FIG. 13 is an explanatory diagram illustrating an example of a vertical cavity surface emitting laser element according to a third embodiment.

In the vertical cavity surface emitting laser element according to the present embodiment, as shown in FIG. 13, the optical film thickness of each of the p-$Al_{0.1}Ga_{0.9}As$ high refraction index layers 153 in 3 pairs above the electric current narrowing layer 117 in the second upper Bragg reflector 116 is $3\lambda/4$. The optical film thickness of the other layers is $\lambda/4$. Even in such a structure, the electric resistance can be reduced, and the same effect can be achieved as for the vertical cavity surface emitting laser element according to the second embodiment including the heat conductivity effect. Specifically, in FIG. 12, the heat conductivity of $Al_{0.1}Ga_{0.9}As$ where the Al composition ratio is 0.1 is also greater than the heat conductivity of $Al_{0.3}Ga_{0.7}As$ where the Al composition ratio is 0.3.

Accordingly, since the optical film thickness of the p-$Al_{0.1}Ga_{0.9}As$ high refraction index layer 153 having the great heat conductivity is great, the vertical cavity surface emitting laser element according to the present embodiment is highly effective in heat transfer. Thus, the temperature of the active layer 114 can be lowered and service life can be made longer.

Furthermore, in the present embodiment, the optical film thickness of the p-$Al_{0.1}Ga_{0.9}As$ high refraction index layer 153 in the second upper Bragg reflector 116 may be greater than $3\lambda/4$, i.e. $(2N+1)\times\lambda/4$ ($N=2, 3, \ldots$). Moreover, each of a part (one or more) of the p-$Al_{0.1}Ga_{0.9}As$ high refraction index layers 153 may have the greater optical film thickness, or all of the p-$Al_{0.1}Ga_{0.9}As$ high refraction index layers 153 may have the greater optical film thickness. Moreover, when the Al composition ratio is great, the layer becomes easily corrosive. However, in the present embodiment, since the Al composition ratio of the p-$Al_{0.1}Ga_{0.9}As$ high refraction index layer 153 formed to be thick is small, the layer is hardly corrosive, and reliability can be improved.

Meanwhile, configurations other than the above are the same as in the second embodiment.

Fourth Embodiment

Next, a fourth embodiment of the present invention will be explained. The present embodiment describes a vertical cavity surface emitting laser element in which vertical cavity surface emitting lasers emitting laser lights, wavelengths of which are different from each other around 894.6 nm, are formed.

Figure 14:
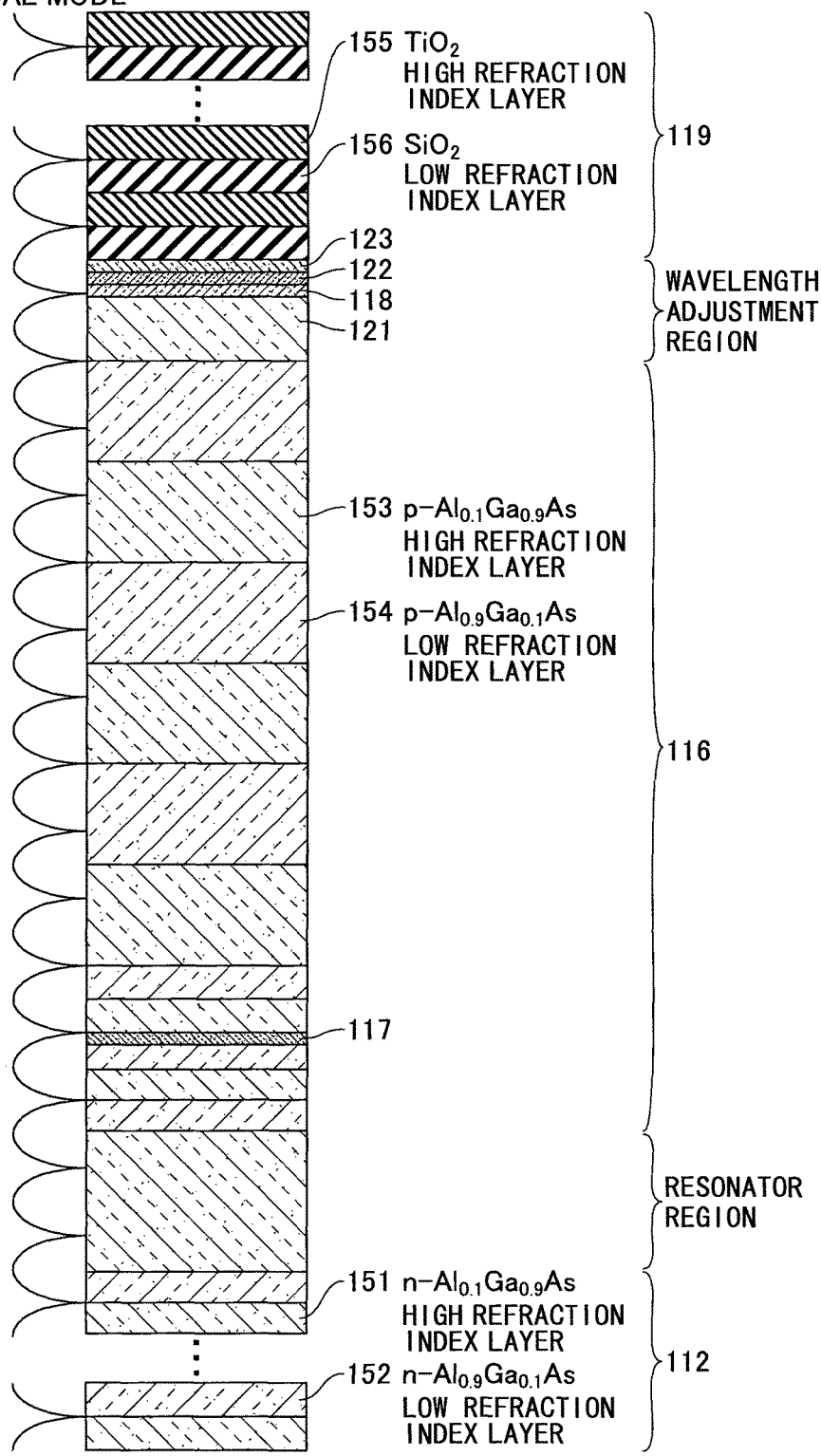
FIG. 14 is an explanatory diagram illustrating an example of a vertical cavity surface emitting laser element according to a fourth embodiment.

The vertical cavity surface emitting laser element according to the present embodiment will be explained with reference to FIG. 14. The vertical cavity surface emitting laser element according to the present embodiment has a structure in which both the thicknesses of the p-$Al_{0.1}Ga_{0.9}As$ high refraction index layer 153 and of the p-$Al_{0.9}Ga_{0.1}As$ low refraction index layer 154 formed in the second upper Bragg reflector 116 are great. Meanwhile, FIG. 14 is a diagram illustrating a structure of a main section of the vertical cavity surface emitting laser element according to the present embodiment.

In the vertical cavity surface emitting laser element according to the present embodiment, the optical film thickness of each of the p-$Al_{0.1}Ga_{0.9}As$ high refraction index layers 153 and the optical film thickness of each of the p-$Al_{0.9}Ga_{0.1}As$ low refraction index layers 154 in 3 pairs above the electric current narrowing layer 117 in the second upper Bragg reflector 116 are both $3\lambda/4$. According to the above structure, the electric resistance can be further lowered.

Furthermore, in the present embodiment, the optical film thicknesses of the p-$Al_{0.1}Ga_{0.9}As$ high refraction index layer 153 and of the p-$Al_{0.9}Ga_{0.1}As$ low refraction index layer 154 in the second upper Bragg reflector 116 may be $(2N+1)\times\lambda/4$ (N=2, 3, ... ).

Meanwhile, configurations other than the above are the same as in the second or third embodiment.

Fifth Embodiment

Figure 15:
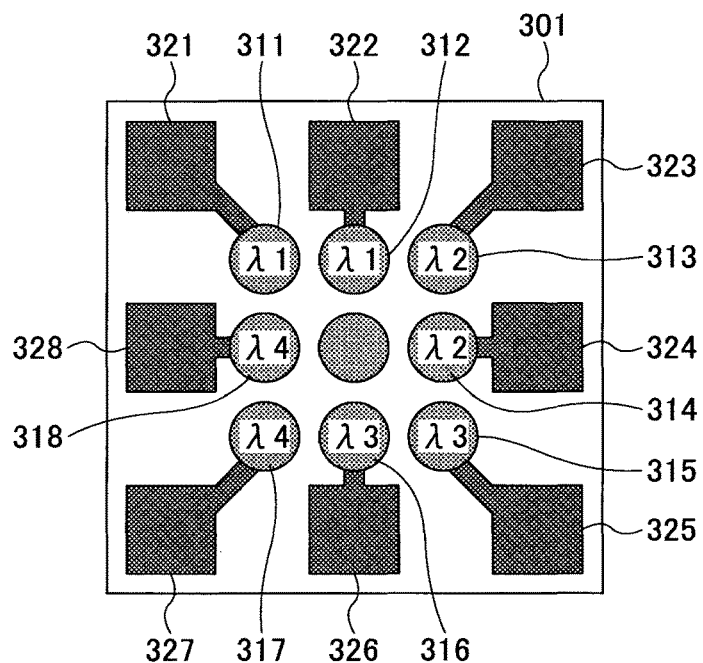
FIG. 15 is a top view illustrating an example of a vertical cavity surface emitting laser element according to a fifth embodiment.

Next, a vertical cavity surface emitting laser element according to a fifth embodiment will be explained with reference to FIG. 15. The vertical cavity surface emitting laser element according to the present embodiment emits laser light with a wavelength of 894.6 nm and has an electric current narrowing structure in which an AlAs layer is selectively oxidized. In the vertical cavity surface emitting laser element according to the present embodiment, as shown in FIG. 15, 8 vertical cavity surface emitting lasers capable of emitting laser lights are formed on a chip 300 μm square. The lasers include vertical cavity surface emitting lasers emitting laser lights with 4 different wavelengths, where two vertical cavity surface emitting lasers emitting laser lights with the same wavelength are assigned for each of the 4 wavelengths. That is, 8 vertical cavity surface emitting lasers 311, 312, 313, 314, 315, 316, 317 and 318 capable of emitting lights are formed on the chip 300 μm square. In the present embodiment, the vertical cavity surface emitting lasers 311 and 312 emit laser lights with wavelength of $\lambda 1$, the vertical cavity surface emitting lasers 313 and 314 emit laser lights with wavelength of $\lambda 2$, the vertical cavity surface emitting lasers 315 and 316 emit laser lights with wavelength of $\lambda 3$, and the vertical cavity surface emitting lasers 317 and 318 emit laser lights with wavelength of $\lambda 4$. Moreover, an upper electrode in the vertical cavity surface emitting laser 311 is connected to an electrode pad 321, an upper electrode in the vertical cavity surface emitting laser 312 is connected to an electrode pad 322, an upper electrode in the vertical cavity surface emitting laser 313 is connected to an electrode pad 323, an upper electrode in the vertical cavity surface emitting laser 314 is connected to an electrode pad 324, an upper electrode in the vertical cavity surface emitting laser 315 is connected to an electrode pad 325, an upper electrode in the vertical cavity surface emitting laser 316 is connected to an electrode pad 326, an upper electrode in the vertical cavity surface emitting laser 317 is connected to an electrode pad 327, and an upper electrode in the vertical cavity surface emitting laser 318 is connected to an electrode pad 328.

In the present embodiment, two vertical cavity surface emitting lasers emitting laser lights with the same wavelength are provided, and one of the two lasers can be used as an auxiliary vertical cavity surface emitting laser. Since there are two vertical cavity surface emitting lasers emitting laser lights with the same wavelength for each of the wavelengths, even when one of the vertical cavity surface emitting lasers emitting laser lights with the same wavelength does not emit laser light due to failure or trouble, another vertical cavity surface emitting laser can be used. Accordingly, the service life of the vertical cavity surface emitting laser element can be made longer and the yield ratio can be enhanced.

Sixth Embodiment

Figure 16:
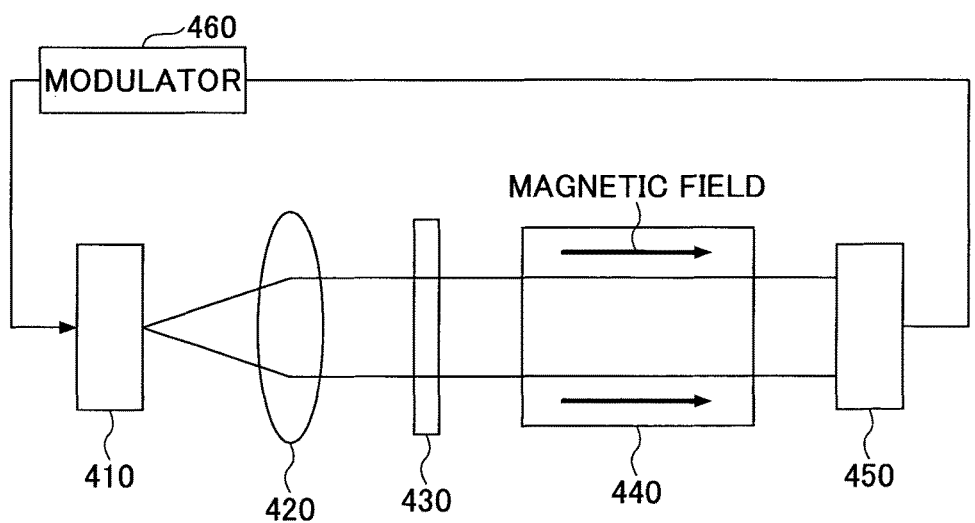
FIG. 16 is a diagram illustrating an example of a structure of an atomic oscillator according to a sixth embodiment.

Next, a sixth embodiment of the present invention will be explained. The present embodiment describes an atomic oscillator using the vertical cavity surface emitting laser element according to any one of the second to fifth embodiments. The atomic oscillator according to the present embodiment will be explained with reference to FIG. 16. The atomic oscillator according to the present embodiment is a small-sized atomic oscillator of the CPT type, including a light source 410, a collimating lens 420, a quarter-wave plate 430, an alkali metal cell 440, a light detector 450 and a modulator 460 (See non-patent document 2 and patent document 2).

Meanwhile, in the atomic oscillator according to the present embodiment, by injecting lights with two different wavelengths of lights including a side band emitted from the vertical cavity surface emitting laser into the alkali metal cell 440, an oscillation frequency is controlled according to a light absorption characteristic due to a quantum interference effect by two frequencies of resonance lights.

For the light source 410, the vertical cavity surface emitting laser element is used according to any one of the second to fifth embodiments of the present invention. In the alkali metal cell 440, alkali atoms of cesium (Cs) are encapsulated, and the transition of the D1 line is used. For the light detector 450, a photodiode is used.

In the atomic oscillator according to the present embodiment, light emitted from the light source 410 is irradiated to the alkali metal cell 440 in which the cesium atom gas is encapsulated, and thereby electrons in the cesium atom are excited. Light having passed through the alkali metal cell 440 is detected by the light detector 450. A signal detected by the light detector 450 is fed back to the modulator 460. The modulator 460 modulates the vertical cavity surface emitting laser element at the light source 410.

Figure 17:
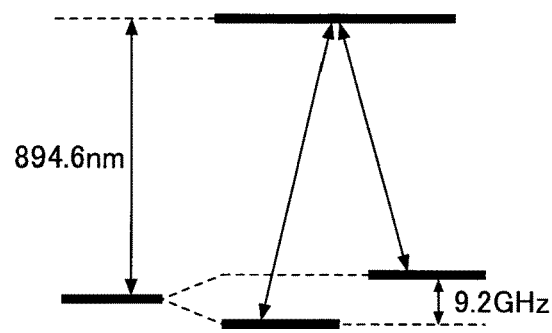
FIG. 17 is an explanatory diagram illustrating an example of an atomic energy level for explaining a CPT type according to the present embodiment.
Figure 18:
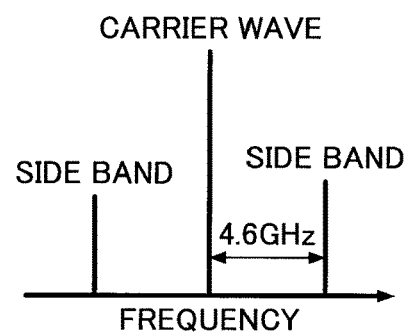
FIG. 18 is an explanatory diagram illustrating an example of an output wavelength on modulation of a vertical cavity surface emitting laser according to the present embodiment.
Figure 19:
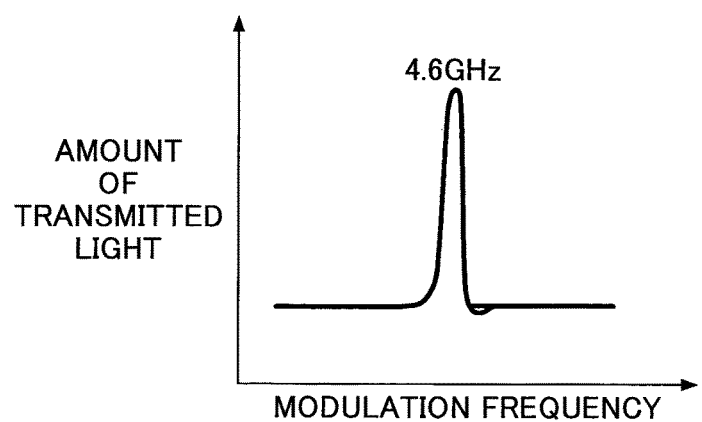
FIG. 19 is a correlation diagram illustrating an example of a correlation between a modulation frequency and an amount of transmitted light according to the present embodiment.

FIG. 17 illustrates a structure of atomic energy level related to the CPT method, which uses a property that when electrons are simultaneously excited from two ground states to an excited state, respectively, a light absorption rate decreases. In the vertical cavity surface emitting laser, there is an element, a wavelength of a carrier wave of which is close to 894.6 nm. The wavelength of the carrier wave can be tuned by changing temperature or output power of the vertical cavity surface emitting laser. As shown in FIG. 18, side bands appear on both sides of the carrier wave due to the modulation. In the present embodiment, the vertical cavity surface emitting laser is modulated with a frequency of 4.6 GHz, so that a frequency difference between the side bands corresponds to the eigen frequency of the cesium atom, i.e. 9.2 GHz. As shown in FIG. 19, the amount of laser light transmitted through the excited cesium atom gas becomes a maximum value when the frequency difference between the side bands corresponds to the eigen frequency difference of the cesium atom. The signal detected at the light detector 450 is fed back at the modulator 460 so that the output power from the light detector 450 is maintained at the maximum value. Accordingly, the modulation frequency of the vertical cavity surface emitting laser at the light source 410 is tuned. Since the eigen frequency of the atom is stable, a value of the modulation frequency is stable. This information is extracted as an output. Meanwhile, in the case where the wavelength is 894.6 nm, a light source having a range of wavelength of light within ±1 nm is required. More preferably, a light source having a range of wavelength of light within ±0.3 nm is required (See non-patent document 4).

The atomic oscillator according to the present embodiment uses the vertical cavity surface emitting laser element according to any one of the second to fifth embodiments. For the vertical cavity surface emitting laser, due to variation of layer thickness in crystal growth, it is difficult to obtain a uniform oscillation wavelength within ±1 nm, as described above. However, by forming plural surface emitting lasers with different oscillation frequencies in a chip, a vertical cavity surface emitting laser having an oscillation wavelength close to 894.6 nm can be selected to operate. Accordingly, the yield ratio related to the oscillation wavelength can be improved, and an atomic oscillator can be produced and provided with low cost. According to the present embodiment, a desired wavelength interval can be controlled with high accuracy, so that the optimum wavelength interval taking account of a distribution of the variation of the oscillation wavelength due to a crystal growth can be set easily, not by merely setting an equal interval. Accordingly, the yield ratio related to the oscillation wavelength can be further improved. Moreover, by using the vertical cavity surface emitting laser element according to the fifth embodiment, a further long-life atomic oscillator can be provided.

Moreover, in the present embodiment, cesium (Cs) is used as the alkali metal and the vertical cavity surface emitting laser, a wavelength of which is 894.6 nm, is employed so as to use the transition of the D1 line. However, a vertical cavity surface emitting laser, a wavelength of which is 852.3 nm, may be employed so as to use the transition of the D2 line. Moreover, rubidium (Rd) may be used as the alkali metal. In this case, a vertical cavity surface emitting laser, a wavelength of which is 795.0 nm, and a vertical cavity surface emitting laser, a wavelength of which is 780.2 nm may be employed so as to use the transition of the D1 and D2 lines, respectively. A material composition of the active layer or the like may be designed according to the wavelength. Moreover, the modulation frequencies in the case of using rubidium are 3.4 GHz and 1.5 GHz for rubidium 87 ($^{87}$Rb) and rubidium 85 ($^{85}$Rb), respectively. Meanwhile, also for the above wavelengths, a light source having a range of wavelength of light within ±1 nm is required.

Further, the present invention is not limited to these embodiments, but various variations and modifications may be made without departing from the scope of the present invention. Moreover, in the embodiment of the present invention, the case where the vertical cavity surface emitting laser element is applied to the atomic oscillator is explained, but the vertical cavity surface emitting laser according to any one of the second to the fifth embodiments may be applied to another apparatus or the like which requires light with a predetermined wavelength, such as a gas sensor. In such a case, in these apparatuses or the like, by using the vertical cavity surface emitting laser light with a predetermined wavelength depending on the use, the same effect is obtained.

The present application is based on and claims the benefit of priority of Japanese Priority Application No. 2014-052058 filed on Mar. 14, 2014, the entire contents of which are hereby incorporated by reference.

DESCRIPTION OF THE REFERENCE NUMERALS 11,111,911 semiconductor substrate
12,112,912 lower Bragg reflector
13,113,913 lower spacer layer
14,114,914 active layer
15,115,915 upper spacer layer
16,116,916,966,976 second upper Bragg reflector
17,117,917 electric current narrowing layer
17a,117a,917a selective oxidization region
17b,117b,917b electric current narrowing region
18,118,918 contact layer
19,119,919 first upper Bragg reflector
31,131,931 protection film
32,132,932 polyimide layer
41,141,941 upper electrode
42,142,942 lower electrode
51,53,55,151,153,155,963,973 high refraction index layer
52,53,56,152,154,156,964,974 low refraction index layer
101,102,103,104,311,312,313,314,315,316,317,318 vertical cavity surface emitting laser
121 second phase adjustment layer
122 first phase adjustment layer
123 wavelength adjustment layer
181,182,183,184,321,322,323,324,325,326,327,328 electrode pad
410 light source
420 collimating lens
430 quarter-wave plate
440 alkali metal cell
450 light detector
460 modulator
956 upper Bragg reflector

The invention claimed is:

1. A surface emitting laser for emitting light with a wavelength $\lambda$, comprising:
   a first reflection mirror provided on a semiconductor substrate;
   a resonator region including an active layer provided on the first reflection mirror;
   a second reflection mirror, including a plurality of low refraction index layers and a plurality of high refraction index layers, provided on the resonator region;
   a contact layer provided on the second reflection mirror;
   a third reflection mirror provided on the contact layer; and
   an electric current narrowing layer provided between the active layer and the second reflection mirror or in the second reflection mirror, wherein optical lengths of at least one of thicknesses of the low refraction index layers and the high refraction index layers formed between the electric current narrowing layer and the contact layer are $(2N+1) \times \lambda/4$ (N=1, 2, ... ).

2. The surface emitting laser as claimed in claim 1, wherein the optical lengths of the thicknesses of at least one of the low refraction index layers formed between the electric current narrowing layer and the contact layer are $(2N+1) \times \lambda/4$ (N=1, 2, ... ).

3. The surface emitting laser as claimed in claim 1, wherein the optical lengths of the thicknesses of at least one of the high refraction index layers formed between the electric current narrowing layer and the contact layer are $(2N+1) \times \lambda/4$ (N=1, 2, ... ).

4. The surface emitting laser as claimed in claim 1, wherein the optical lengths of the thicknesses of at least one of the low refraction index layers formed between the electric current narrowing layer and the contact layer are $3\lambda/4$.

5. The surface emitting laser as claimed in claim 1, wherein the optical lengths of the thicknesses of at least one of the high refraction index layers formed between the electric current narrowing layer and the contact layer are $3\lambda/4$.

6. The surface emitting laser as claimed in claim 1, wherein the second reflection mirror is formed by alternately laminating the low refraction index layer formed of $Al_xGa_{1-x}As$ and the high refraction index layer formed of $Al_yGa_{1-y}As$, x being greater than y.

7. The surface emitting laser as claimed in claim 1, wherein the third reflection mirror is formed by alternately laminating films formed of dielectric materials, refraction indices of which are different from each other.

8. A surface emitting laser element comprising the plurality of surface emitting lasers as claimed in claim 7, each of the surface emitting lasers including a wavelength adjustment region provided between the second reflection mirror and the third reflection mirror, wherein the wavelength adjustment region includes a first phase adjustment layer, the contact layer provided on the first phase adjustment layer, a second phase adjustment layer provided on the contact layer and a wavelength adjustment layer provided on the second phase adjustment layer, and wherein the wavelength adjustment layer is formed by laminating a plurality of semiconductor films, a wavelength of light emitted from the surface emitting laser being determined based on a thickness of the wavelength adjustment layer.

9. The surface emitting laser element as claimed in claim 8, wherein the wavelength adjustment layer is formed by laminating a film formed of a first wavelength adjustment material and a film formed of a second wavelength adjustment material, and wherein the thickness of the wavelength adjustment layer is changed by removing the semiconductor films from one layer to the next using a first etchant for removing the film formed of the first wavelength adjustment material and a second etchant for removing the film formed of the second wavelength adjustment material, the first etchant being different from the second etchant.

10. The surface emitting laser element as claimed in claim 9, wherein the first wavelength adjustment material includes GaAsP or GaAs, and the second wavelength adjustment material includes GaInP.

11. The surface emitting laser element as claimed in claim 8, wherein the plurality of surface emitting lasers emit laser lights, wavelengths of which are different from each other.

12. The surface emitting laser element as claimed claim 8, wherein the plurality of surface emitting lasers include a plurality of surface emitting lasers which emit lights having the same wavelength.

13. The surface emitting laser element as claimed in claim 8, wherein the wavelength is 780.2 nm, 795.0 nm, 852.3 nm or 894.6 nm.

14. An atomic oscillator, comprising:
the surface emitting laser element as claimed in claim 8;
an alkali metal cell that encapsulates alkali metal; and
a light detection unit that detects light transmitted through the alkali metal cell, the light being emitted from a surface emitting laser of the surface emitting laser element to the alkali metal cell, wherein an oscillation frequency is controlled according to a light absorption characteristic of a quantum interference effect for two kinds of resonant lights, by injecting lights with two different wavelengths of lights including sidebands emitted from the surface emitting laser into the alkali metal cell.

15. The atomic oscillator as claimed in claim 14, wherein the lights with two different wavelengths are lights of the sidebands emitted from the surface emitting laser.

16. The atomic oscillator as claimed in claim 14, wherein the alkali metal encapsulated in the alkali metal cell is rubidium or cesium.

17. A surface emitting laser comprising:
a first reflection mirror provided on a semiconductor substrate;
a resonator region including an active layer provided on the first reflection mirror;
a second reflection mirror, including a plurality of low refraction index layers and a plurality of high refraction index layers, provided on the resonator region;
a contact layer provided on the second reflection mirror;
a third reflection mirror provided on the contact layer; and
an electric current narrowing layer provided between the active layer and the second reflection mirror or in the second reflection mirror, wherein a difference between refraction indices of the low refraction index layers and the high refraction index layers formed between the electric current narrowing layer and the contact layer is less than or equal to 0.232.

18. The surface emitting laser as claimed in claim 17, wherein the third reflection mirror is formed by alternately laminating films formed of dielectric materials, refraction indices of which are different from each other.

19. A surface emitting laser element comprising the plurality of surface emitting lasers as claimed in claim 18, each of the surface emitting lasers including a wavelength adjustment region provided between the second reflection mirror and the third reflection mirror, wherein the wavelength adjustment region includes a first phase adjustment layer, the contact layer provided on the first phase adjustment layer, a second phase adjustment layer provided on the contact layer and a wavelength adjustment layer provided on the second phase adjustment layer, and wherein the wavelength adjustment layer is formed by laminating a plurality of semiconductor films, a wavelength of light emitted from the surface emitting laser being determined based on a thickness of the wavelength adjustment layer.

20. An atomic oscillator, comprising:
the surface emitting laser element as claimed in claim 19;
an alkali metal cell that encapsulates alkali metal; and
a light detection unit that detects light transmitted through the alkali metal cell, the light being emitted from a surface emitting laser of the surface emitting laser element to the alkali metal cell, wherein an oscillation frequency is controlled according to a light absorption characteristic of a quantum interference effect for two kinds of resonant lights, by injecting lights with two different wavelengths of lights including sidebands emitted from the surface emitting laser into the alkali metal cell.

* * * * *